(12) United States Patent
Lim et al.

(10) Patent No.: US 9,019,410 B2
(45) Date of Patent: Apr. 28, 2015

(54) IMAGE SENSORS COMPRISING PHOTODIODES AND IMAGE PROCESSING DEVICES INCLUDING THE SAME

(75) Inventors: Yong Lim, Hwaseong-si (KR); Moo Sup Lim, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 246 days.

(21) Appl. No.: 13/617,296

(22) Filed: Sep. 14, 2012

(65) Prior Publication Data

US 2013/0141619 A1 Jun. 6, 2013

(30) Foreign Application Priority Data

Dec. 2, 2011 (KR) ........................ 10-2011-0128659

(51) Int. Cl.
| | | |
|---|---|---|
| *H04N 3/14* | (2006.01) | |
| *H04N 5/335* | (2011.01) | |
| *H01L 27/146* | (2006.01) | |
| *H04N 5/355* | (2011.01) | |
| *H04N 5/3745* | (2011.01) | |
| *H01L 31/062* | (2012.01) | |
| *H01L 31/113* | (2006.01) | |

(52) U.S. Cl.
CPC ........ *H01L 27/14609* (2013.01); *H04N 5/3559* (2013.01); *H04N 5/3745* (2013.01); *H04N 5/37452* (2013.01)

(58) Field of Classification Search
CPC ... H04N 5/235; H04N 5/2351; H04N 5/2352; H04N 5/2353; H04N 5/243

USPC ............. 348/216.1, 217.1, 229.1, 230.1, 348/300–301, 308; 257/291–292
See application file for complete search history.

(56) References Cited

U.S. PATENT DOCUMENTS

| | | | |
|---|---|---|---|
| 7,446,807 B2 | 11/2008 | Hong | |
| 7,718,459 B2 | 5/2010 | Patrick et al. | |
| 2005/0224843 A1* | 10/2005 | Boemler | 257/233 |
| 2009/0237540 A1* | 9/2009 | Johnson | 348/308 |
| 2010/0302407 A1* | 12/2010 | Ayers et al. | 348/230.1 |
| 2012/0188427 A1* | 7/2012 | Solhusvik | 348/300 |

FOREIGN PATENT DOCUMENTS

| | | |
|---|---|---|
| JP | 2008079001 A | 4/2008 |
| JP | 2008537340 A | 9/2008 |
| KR | 20070119744 A | 12/2007 |

* cited by examiner

*Primary Examiner* — Kelly L Jerabek

(74) *Attorney, Agent, or Firm* — Harness, Dickey & Pierce, PLC

(57) ABSTRACT

An image sensor may include a photodiode configured to convert an optical signal into photogenerated charge, a sensing node adjacent to the photodiode and configured to sense the photogenerated charge, a read-out circuit configured to convert the photogenerated charge into an electrical signal and to output the electrical signal through an output line, and/or at least one capacitor formed between the sensing node and a conversion gain control line. The conversion gain control line corresponding to the at least one capacitor may be selectively connected to a ground line or the output line based on at least one control signal.

20 Claims, 19 Drawing Sheets

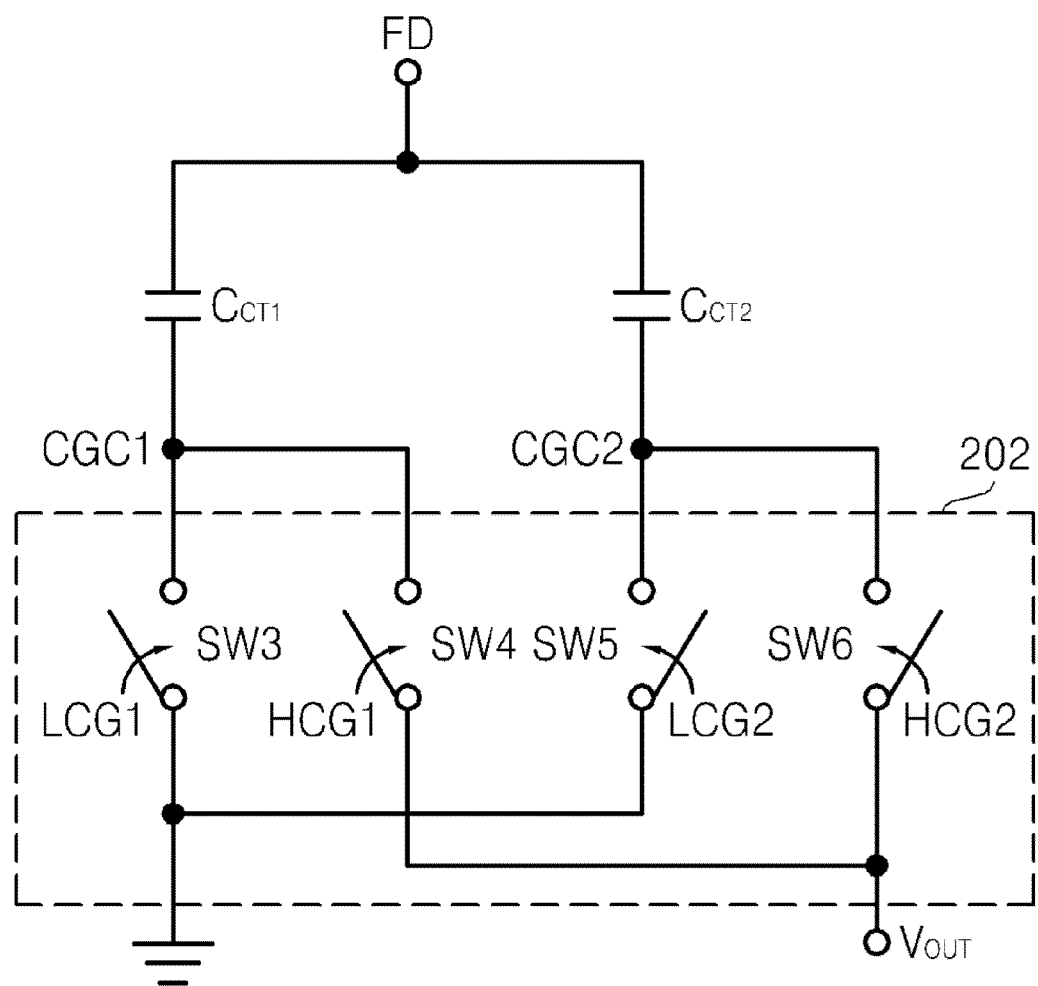

IMAGE SENSORS COMPRISING PHOTODIODES AND IMAGE PROCESSING DEVICES INCLUDING THE SAME

CROSS-REFERENCE TO RELATED APPLICATION(S)

This application claims priority from Korean Patent Application No. 10-2011-0128659, filed on Dec. 2, 2011, in the Korean Intellectual Property Office (KIPO), the entire contents of which are incorporated herein by reference.

BACKGROUND

1. Field

Example embodiments may relate to image sensors and/or image processing devices including the same. Example embodiments also may relate to image sensors for adjusting conversion gains and/or image processing devices including the same.

2. Description of Related Art

A sensor including a pixel array, which senses effective physical quantity such as light intensity, temperature, mass, or time and outputs an electrical signal, is used in various areas. In particular, an image sensor measuring an image of a photographed object is applied to various fields. Conversion gain with which an optical signal is converted into an electrical signal is important in image sensors.

It is necessary to increase the conversion gain when the quantity of light is small based on the intensity of light input to an image sensor and to decrease the conversion gain when the quantity of light is big. However, when additional elements are provided in a pixel to adjust the conversion gain, an area that a light receiving region takes in the entire pixel is reduced, which is inefficient.

Therefore, an approach for adjusting the conversion gain according to the quantity of incident light without affecting the light receiving area is desired.

SUMMARY

In some example embodiments, an image sensor may comprise a photodiode configured to convert an optical signal into photogenerated charge, a sensing node adjacent to the photodiode and configured to sense the photogenerated charge, a read-out circuit configured to convert the photogenerated charge into an electrical signal and to output the electrical signal through an output line, and/or at least one capacitor formed between the sensing node and a conversion gain control line. The conversion gain control line corresponding to the at least one capacitor may be selectively connected to a ground line or the output line based on at least one control signal.

In some example embodiments, the read-out circuit may comprises a drive transistor configured to operate as a source follower amplifier having an output of the sensing node as an input and/or a select transistor connected in series between a source terminal of the source follower amplifier and the output line.

In some example embodiments, the conversion gain control line may be separated from the output line. The conversion gain control line may be configured to surround the sensing node.

In some example embodiments, the image sensor may further comprise at least two capacitors. The sensing node may be horizontally between a first conversion gain control line and a second conversion gain control line, which are separated from the output line. A first capacitor of the at least two capacitors may be formed between the first conversion gain control line and the sensing node. A second capacitor of the at least two capacitors may be formed between the sensing node and the second conversion gain control line.

In some example embodiments, the image sensor may further comprise at least two capacitors. A first conversion gain control line may be separated from the output line and may be configured to surround the sensing node. A second conversion gain control line may be stacked on the first conversion gain control line. A first capacitor of the at least two capacitors may be formed between the first conversion gain control line and the sensing node. A second capacitor of the at least two capacitors may be formed between the sensing node and the second conversion gain control line.

In some example embodiments, the image sensor may further comprise a switch configured to be connected between the conversion gain control line and a power supply voltage, and to connect the conversion gain control line to the power supply voltage based on a boosting control signal. When the conversion gain control line is connected to the ground line, a voltage at the sensing node may be increased based on the boosting control signal by a boosting voltage corresponding to the power supply voltage.

In some example embodiments, when the conversion gain control line is connected to the output line, the voltage at the sensing node may be increased based on the boosting control signal by a boosting voltage corresponding to a reset voltage.

In some example embodiments, an image sensor may comprise a pixel array comprising a plurality of pixels, a timing controller configured to control operation of the pixel array and to generate at least one control signal for controlling an output of each of the pixels, and/or a switching circuit comprising a plurality of switches corresponding to a plurality of column lines comprised in the pixel array to adjust a conversion gain of pixels corresponding to each of the columns based on the at least one control signal. Each pixel may comprise a photodiode configured to convert an optical signal into photogenerated charge, a sensing node adjacent to the photodiode and configured to sense the photogenerated charge, a read-out circuit configured to convert the photogenerated charge into an electrical signal and to output the electrical signal through an output line, and/or at least one capacitor formed between the sensing node and a conversion gain control line. The switching circuit may be configured to selectively control connection of the conversion gain control line.

In some example embodiments, the read-out circuit may comprise a drive transistor configured to operate as a source follower amplifier having an output of the sensing node as an input and/or a select transistor connected in series between a source terminal of the source follower amplifier and the output line.

In some example embodiments, the conversion gain control line corresponding to the at least one capacitor may be selectively connected to a ground line or the output line based on the at least one control signal.

In some example embodiments, an image processing device may comprise the image sensor and/or a processor configured to control operation of the image sensor.

In some example embodiments, the image processing device may include one or more of a mobile phone, a tablet personal computer (PC), and a digital single-lens reflex (DSLR) camera.

In some example embodiments, an image sensor may comprise a photodiode configured to convert an optical signal into photogenerated charge, a sensing node configured to sense the photogenerated charge, a read-out circuit configured to convert the photogenerated charge into an electrical signal and to output the electrical signal, and/or one or more capacitors between the sensing node and one or more conversion gain control lines. The one or more conversion gain control lines corresponding to the one or more capacitors may be selectively connected to a ground line or an output line based on one or more control signals.

In some example embodiments, a first conversion gain control line corresponding to a first capacitor may be selectively connected to the ground line or the output line based on a first control signal. A second conversion gain control line corresponding to a second capacitor may be selectively connected to the ground line or the output line based on a second control signal.

In some example embodiments, the image sensor may further comprise at least two capacitors. The sensing node may be between a first conversion gain control line and a second conversion gain control line. The first conversion gain control line may be separated from the output line. The second conversion gain control line may be separated from the output line. A first capacitor of the at least two capacitors may be between the sensing node and the first conversion gain control line. A second capacitor of the at least two capacitors may be between the sensing node and the second conversion gain control line.

In some example embodiments, the first conversion gain control line may be on a first side of the sensing node. The second conversion gain control line may be on a second side of the sensing node. The first side of the sensing node may be opposite to the second side of the sensing node.

In some example embodiments, a first portion of the first conversion gain control line may be on a first side of the sensing node. A second portion of the first conversion gain control line may be on a second side of the sensing node. The second conversion gain control line may be on a third side of the sensing node. The first side of the sensing node may be opposite to the second side of the sensing node.

In some example embodiments, a computing system may comprise the image sensor.

In some example embodiments, an image processing device may comprise the image sensor.

In some example embodiments, a camera system may comprise the image sensor.

BRIEF DESCRIPTION OF THE DRAWINGS

The above and/or other aspects and advantages will become more apparent and more readily appreciated from the following detailed description of example embodiments, taken in conjunction with the accompanying drawings, in which:

FIGS. 6A and 6B are detailed circuit diagrams of a pixel of an image sensor according to some example embodiments;

DETAILED DESCRIPTION

Figure 1:
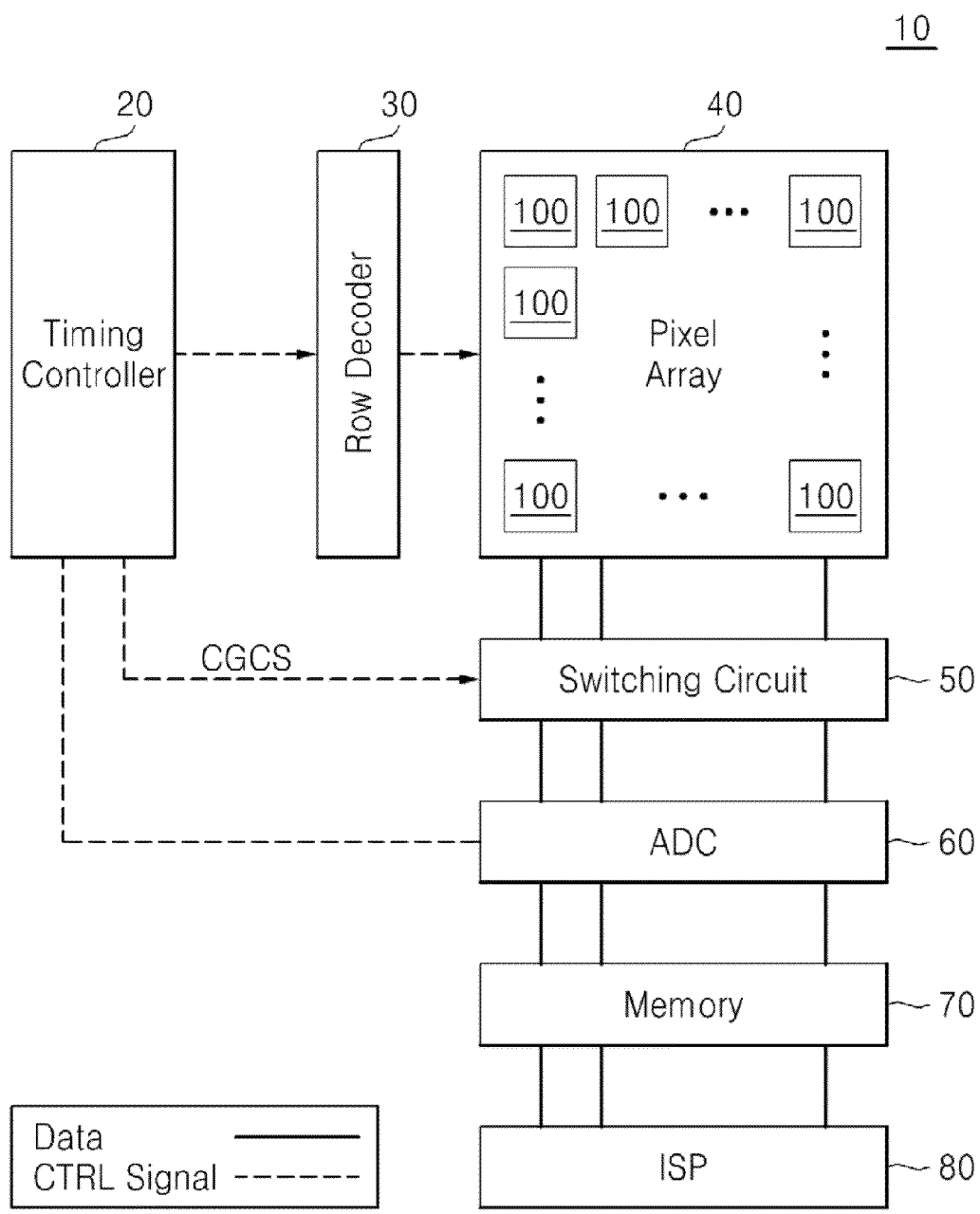
FIG. 1 is a block diagram of an image sensor according to some example embodiments.

Example embodiments will now be described more fully with reference to the accompanying drawings. Embodiments, however, may be embodied in many different forms and should not be construed as being limited to the embodiments set forth herein. Rather, these example embodiments are provided so that this disclosure will be thorough and complete, and will fully convey the scope to those skilled in the art. In the drawings, the thicknesses of layers and regions may be exaggerated for clarity.

It will be understood that when an element is referred to as being "on," "connected to," "electrically connected to," or "coupled to" to another component, it may be directly on, connected to, electrically connected to, or coupled to the other component or intervening components may be present. In contrast, when a component is referred to as being "directly on," "directly connected to," "directly electrically connected to," or "directly coupled to" another component, there are no intervening components present. As used herein, the term "and/or" includes any and all combinations of one or more of the associated listed items.

It will be understood that although the terms first, second, third, etc., may be used herein to describe various elements, components, regions, layers, and/or sections, these elements, components, regions, layers, and/or sections should not be limited by these terms. These terms are only used to distinguish one element, component, region, layer, and/or section from another element, component, region, layer, and/or section. For example, a first element, component, region, layer, and/or section could be termed a second element, component, region, layer, and/or section without departing from the teachings of example embodiments.

Spatially relative terms, such as "beneath," "below," "lower," "above," "upper," and the like may be used herein for ease of description to describe the relationship of one component and/or feature to another component and/or feature, or other component(s) and/or feature(s), as illustrated in the drawings. It will be understood that the spatially relative terms are intended to encompass different orientations of the device in use or operation in addition to the orientation depicted in the figures.

The terminology used herein is for the purpose of describing particular example embodiments only and is not intended to be limiting of example embodiments. As used herein, the singular forms "a," "an," and "the" are intended to include the plural forms as well, unless the context clearly indicates otherwise. It will be further understood that the terms "comprises," "comprising," "includes," and/or "including," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and should not be interpreted in an idealized or overly formal sense unless expressly so defined herein.

Reference will now be made to example embodiments, which are illustrated in the accompanying drawings, wherein like reference numerals may refer to like components throughout.

FIG. 1 is a block diagram of an image sensor 10 according to some example embodiments. The image sensor 10 includes a timing controller 20, a row decoder 30, a pixel array 40, a switching circuit 50, an analog-to-digital converter (ADC) 60, a memory 70, and an image signal processor (ISP) 80.

The image sensor 10 converts an optical signal into an electrical signal and outputs the electrical signal. The timing controller 20 controls operation timing of the image sensor 10. For instance, the timing controller 20 may control a light collection time using a transfer gate control signal of the image sensor 10. The timing controller 20 also outputs a conversion gain control signal CGCS for adjusting the conversion gain of pixels included in the pixel array 40 to the switching circuit 50.

The pixel array 40 includes a plurality of pixels 100, which will be described in detail later.

The switching circuit 50 may include a plurality of switches respectively corresponding to a plurality of column lines included in the pixel array 40 to adjust the conversion gain of pixels 100 corresponding to each of the column lines based on the conversion gain control signal CGCS.

The row decoder 30 controls operation (or output) timing for one of a plurality of rows in the pixel array 40 in response to a row address provided from the timing controller 20.

The ADC 60 converts an analog signal output from the pixel array 40 into a digital signal. The memory 70 may be referred to as a buffer memory or a frame memory. The memory 70 may store the digital signal in units of frames. The ISP 80 performs necessary signal processing using an image signal stored in a digital form in the memory 70. The signal processing may include color interpolation, color correction, auto white balance, gamma correction, color saturation correction, formatting, bad pixel correction, and hue correction.

The ADC 60 may have a different structure depending on the application of a correlated double sampling (CDS) scheme, i.e. analog CDS, digital CDS, or dual CDS. The ADC 60 may be implemented as a column ADC provided for each of the columns in the image sensor 10 or a single ADC provided for all of the columns.

The ISP 80 is included in the image sensor 10 in the embodiments illustrated in FIG. 1, but the inventive concept is not restricted to the current embodiments. For instance, the ISP 80 may be implemented in a chip separated from the image sensor 10.

Figure 2A:
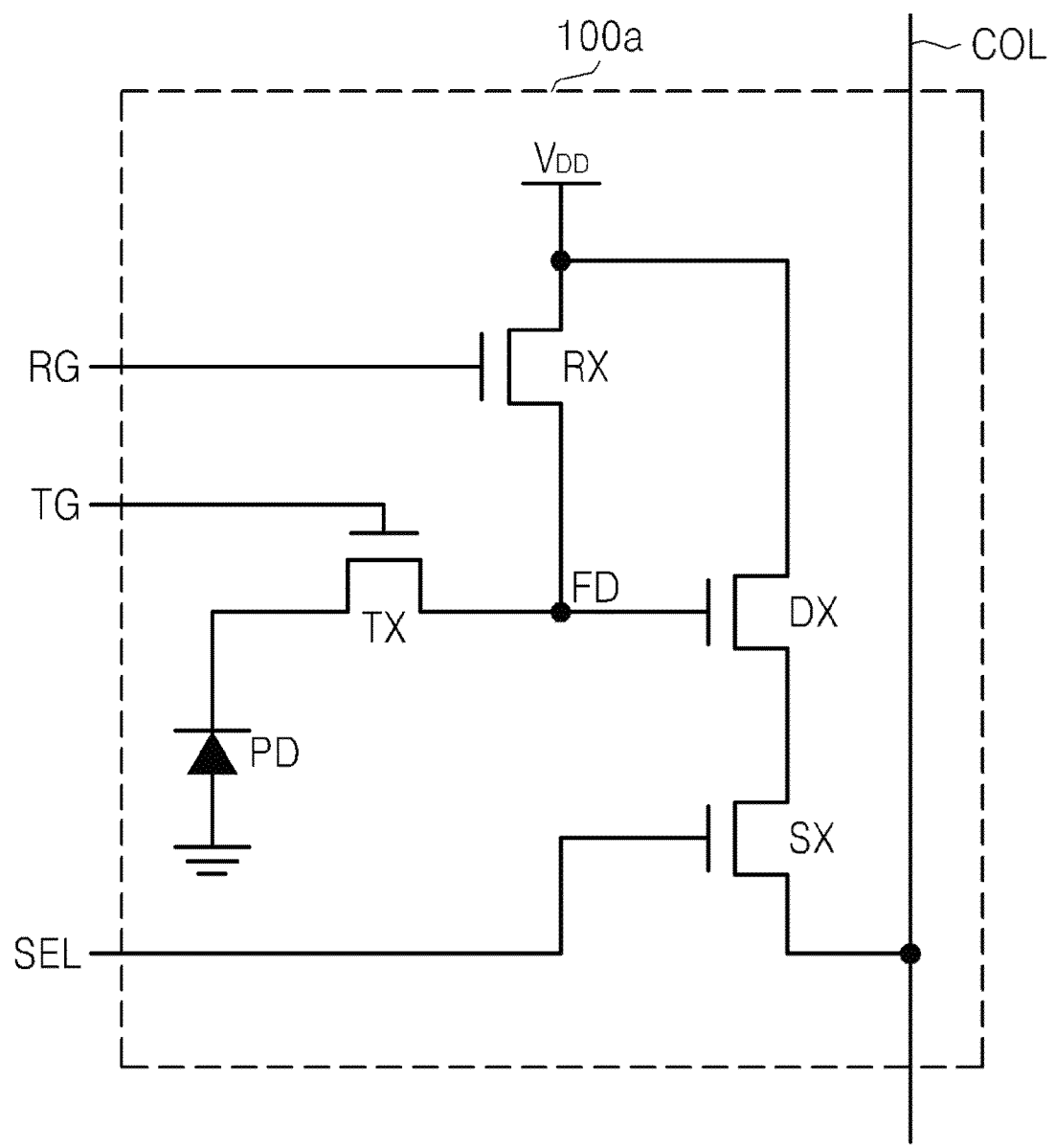
FIGS. 2A through 2C are detailed circuit diagrams of some example embodiments of a pixel.
Figure 2B:
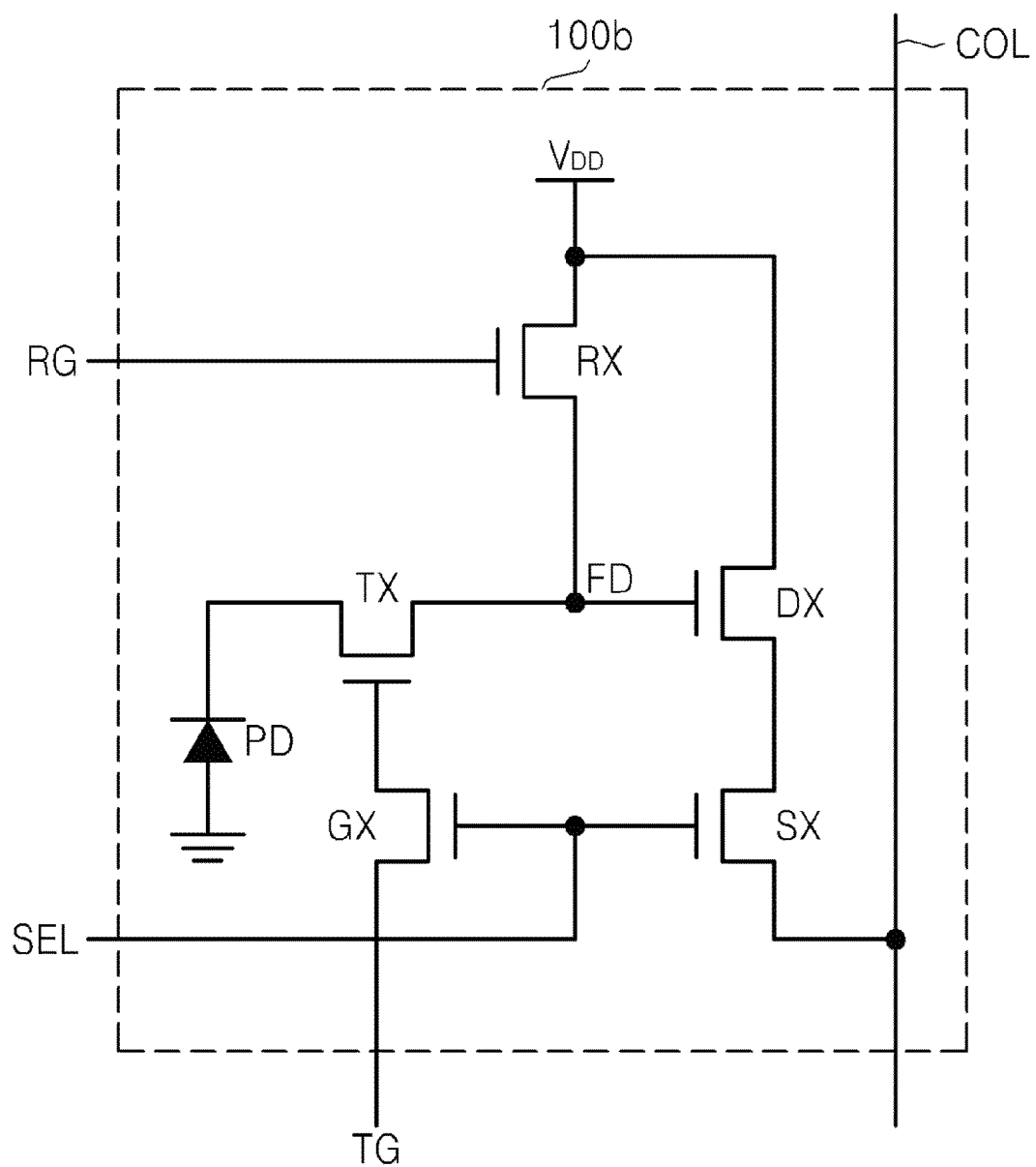
Figure 2C:
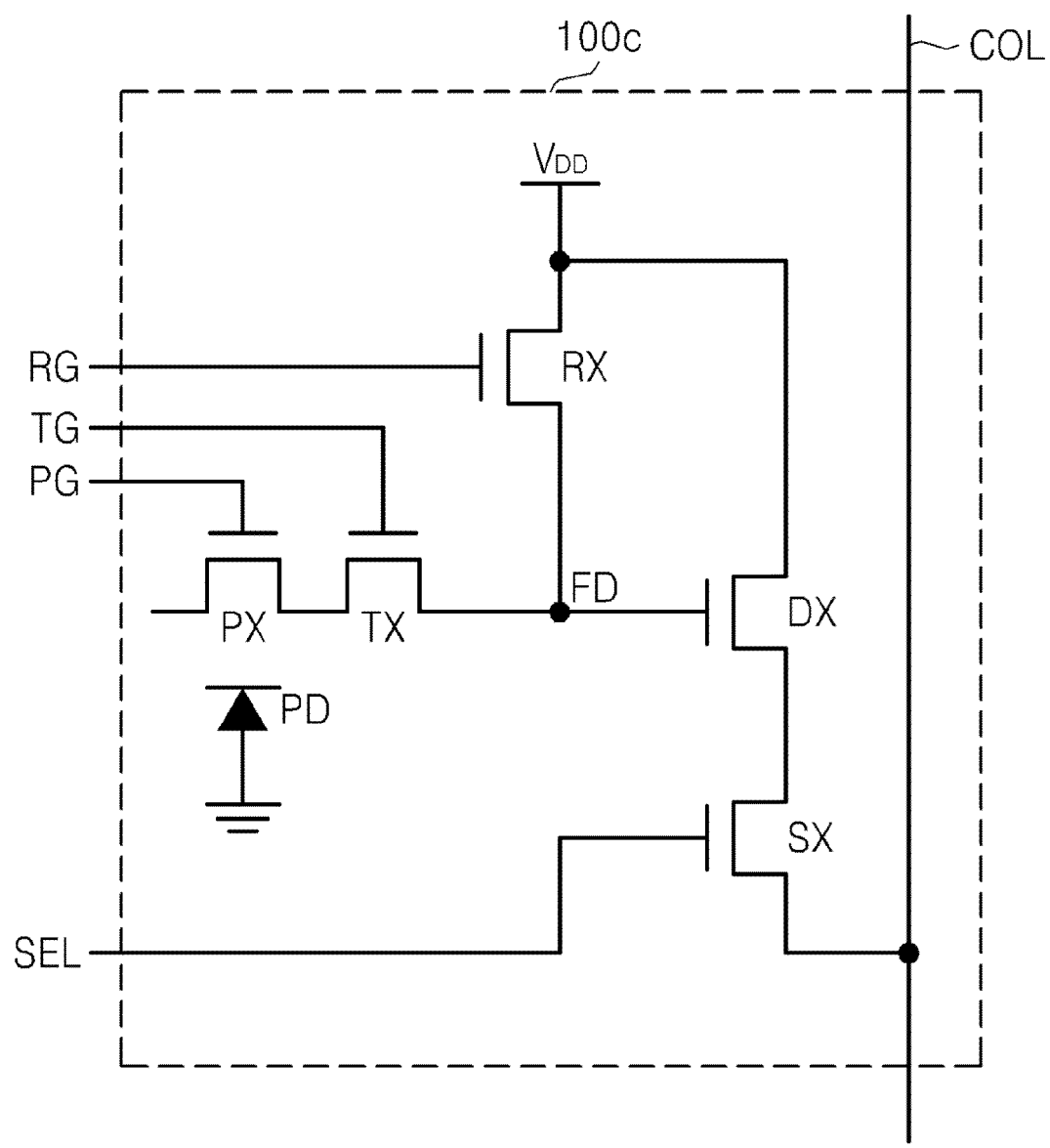

FIGS. 2A through 2C are detailed circuit diagrams of different examples of a pixel.

Referring to FIG. 2A, a pixel 100a includes a photodiode PD, a transfer transistor TX, a sensing node FD, a reset transistor RX, a drive transistor DX, and a select transistor SX.

The photodiode PD may include at least one among a photo transistor, a photo gate, a pinned photodiode (PPD), and a combination thereof.

FIG. 2A shows a 4-transistor (4T) structure that includes a single photodiode PD and four metal-oxide-semiconductor (MOS) transistors TX, RX, DX, and SX, but the inventive concept is not restricted to this example. FIG. 2A also shows column line COL, power supply voltage $V_{DD}$, reset gate control signal RG, selection control signal SEL, and transfer gate control signal TG. Other examples of a pixel are illustrated in FIGS. 2B and 2C.

Referring to FIG. 2B, a pixel 100b has a 5-transistor (5T) structure that includes a photodiode PD, a reset transistor RX, a transfer transistor TX, a drive transistor DX, a select transistor SX, and one more transistors GX.

Referring to FIG. 2C, a pixel 100c has a 5T structure that includes a photodiode PD, a reset transistor RX, a transfer transistor TX, a drive transistor DX, a select transistor SX, and one more transistors PX. FIG. 2C also shows photodiode gate control signal PG.

Figure 3A:
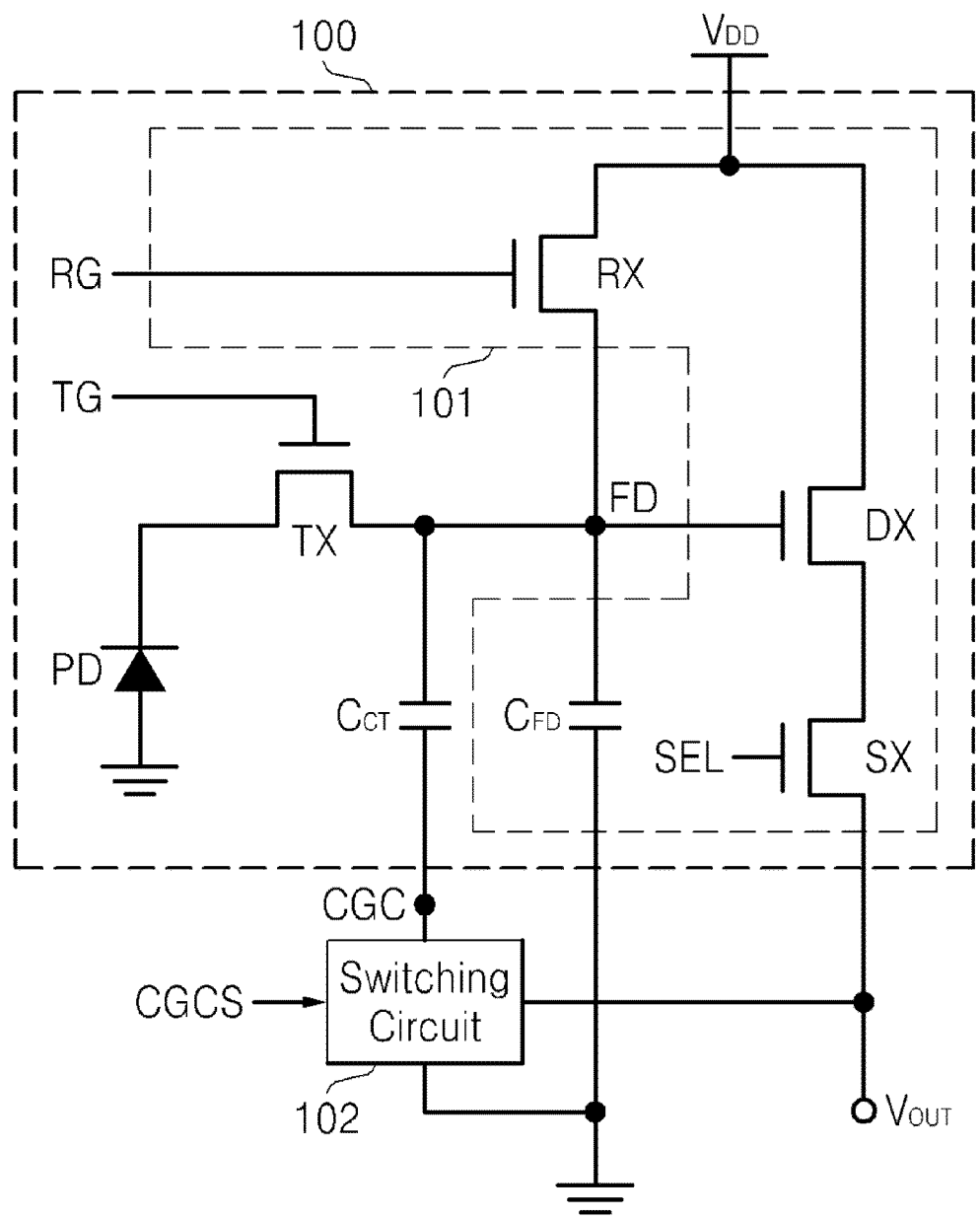
FIGS. 3A and 3B are detailed circuit diagrams of a pixel of an image sensor according to some example embodiments.
Figure 3B:
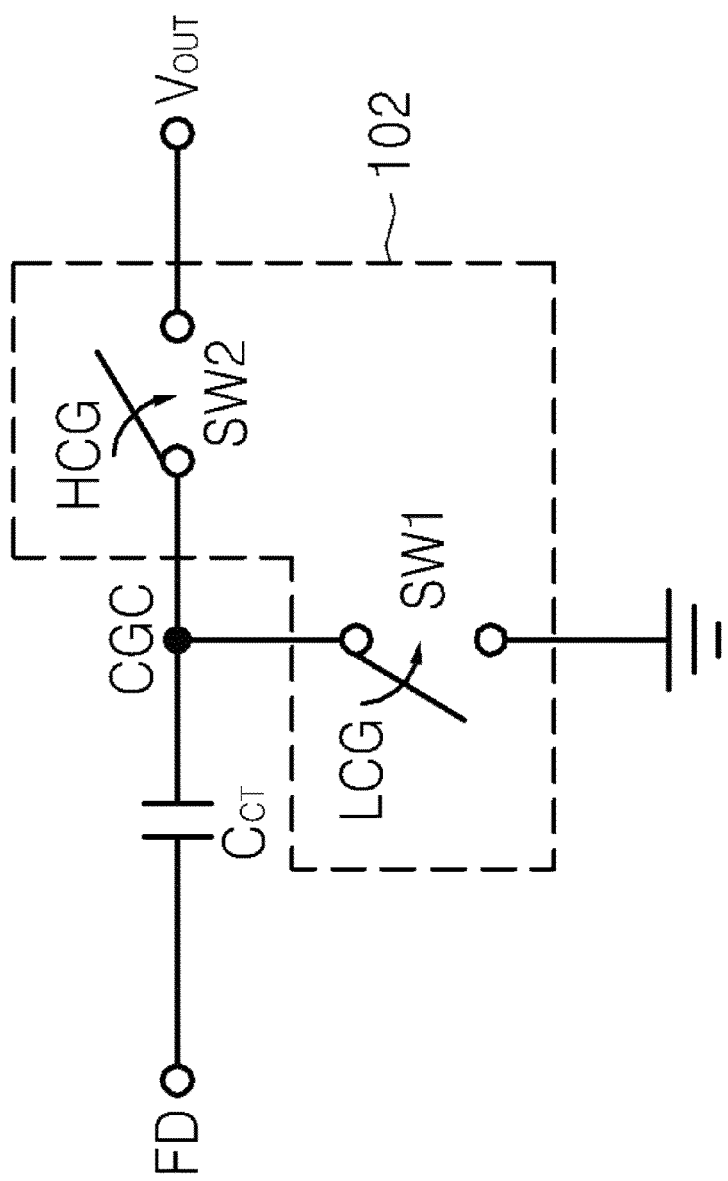

FIGS. 3A and 3B are detailed circuit diagrams of a pixel 100 of an image sensor according to some embodiments of the inventive concept. In the current embodiments, the pixel 100 having the 4T structure that includes four transistors TX, RX, DX, and SX and a single photodiode PD is described as an example, but the inventive concept is not restricted to this example. For instance, the embodiments of the inventive concept can be applied to any circuits that include the photodiode PD and at least three transistors including the drive transistor DX and the select transistor SX.

Referring to FIG. 3A, the pixel 100 includes a photodiode PD, a sensing node FD, a capacitor $C_{CT}$, a read-out circuit 101, and an output line. The photodiode PD converts a received optical signal to output photogenerated charge.

The sensing node FD is adjacent to the photodiode PD and senses the photogenerated charge. A source terminal of the reset transistor RX may be referred to as a floating diffusion node or sensing node FD.

The read-out circuit 101 converts the photogenerated charge of the sensing node FD into an electrical signal $V_{OUT}$. The output line is connected to the read-out circuit 101 and outputs the electrical signal $V_{OUT}$. The read-out circuit 101 may include the reset transistor RX, the drive transistor DX, and the select transistor SX.

The sensing node FD may include a parasitic capacitor $C_{FD}$ formed through a metal contact among a gate of the drive transistor DX, a source terminal of the reset transistor RX, and a drain terminal of the transfer transistor TX.

The capacitor $C_{CT}$ may be a parasitic capacitor formed between the sensing node FD and a conversion gain control line CGC. A switching circuit 102 connects the conversion gain control line CGC to a ground line or the output line based on a conversion gain control signal CGCS. The conversion gain control signal CGCS may include a low conversion gain control signal LCG and a high conversion gain control signal HCG.

Referring to FIGS. 1 through 3B, the capacitor $C_{CT}$ is formed between the sensing node FD and the conversion gain control line CGC, and the switching circuit 102 is connected among the capacitor $C_{CT}$, the ground line, and the output line.

The switching circuit 102 may selectively connect the conversion gain control line CGC to the ground line or the output line based on the conversion gain control signals LCG and HCG.

In other words, the timing controller 20 may output the low conversion gain control signal LCG and the high conversion gain control signal HCG for controlling a first switch SW1 and a second switch SW2, respectively, so that the conversion gain control line CGC is connected to the ground line or the output line based on the strength of an optical signal received from the photodiode PD.

For instance, when the strength of the optical signal received from the photodiode PD is high, the first switch SW1 is closed based on the low conversion gain control signal LCG output from the timing controller 20, so that photogenerated charge output from the photodiode PD is accumulated at the capacitor $C_{CT}$ and the parasitic capacitor $C_{FD}$.

As a result, when the low conversion gain control signal LCG is received from the timing controller 20, capacitance at the sensing node FD increases to $C_{CT}+C_{FD}$. The increase of effective capacitance at the sensing node FD leads the decrease of an output voltage, thereby decreasing the conversion gain of the image sensor.

On the contrary, when the strength of the optical signal received from the photodiode PD is low, the second switch SW2 is closed based on the high conversion gain control signal HCG output from the timing controller 20. Then, the voltage of the sensing node FD and the voltage of the conversion gain control line CGC shift in the same direction (e.g., in an increasing or a decreasing direction), and therefore, the change in a potential difference between the sensing node FD and the conversion gain control line CGC decreases. At this time, when the voltage gain of the drive transistor DX is 1, a voltage, i.e., the electrical signal $V_{OUT}$ at the conversion gain control line CGC becomes the same as a voltage of the sensing node FD, and therefore, a voltage difference between both ends of the capacitor $C_{CT}$ is maintained constant and charge is not accumulated at the capacitor $C_{CT}$. As a result, photogenerated charge output from the photodiode PD is accumulated at only the parasitic capacitor $C_{FD}$.

As described above, as the voltage of the sensing node FD and the voltage of the conversion gain control line CGC shift in the same direction, effective capacitance $C_{CT,\mathit{eff}}$ of the capacitor $C_{CT}$ is reduced as is given by Equation 1. At this time, the drive transistor DX of the read-out circuit 101 has a gain $A_{SF}$ of a positive value, e.g., 0.8 through 0.9, less than 1 as a source follower.

$$C_{CT,\mathit{eff}}=(1-A_{SF})C_{CT}. \qquad (1)$$

Accordingly, when the high conversion gain control signal HCG is received from the timing controller 20, capacitance at the sensing node FD decreases to $(0.1)C_{CT}+C_{FD}$. The decrease of the effective capacitance at the sensing node FD leads the increase in the output voltage, thereby increasing the conversion gain of the image sensor.

Figure 4:
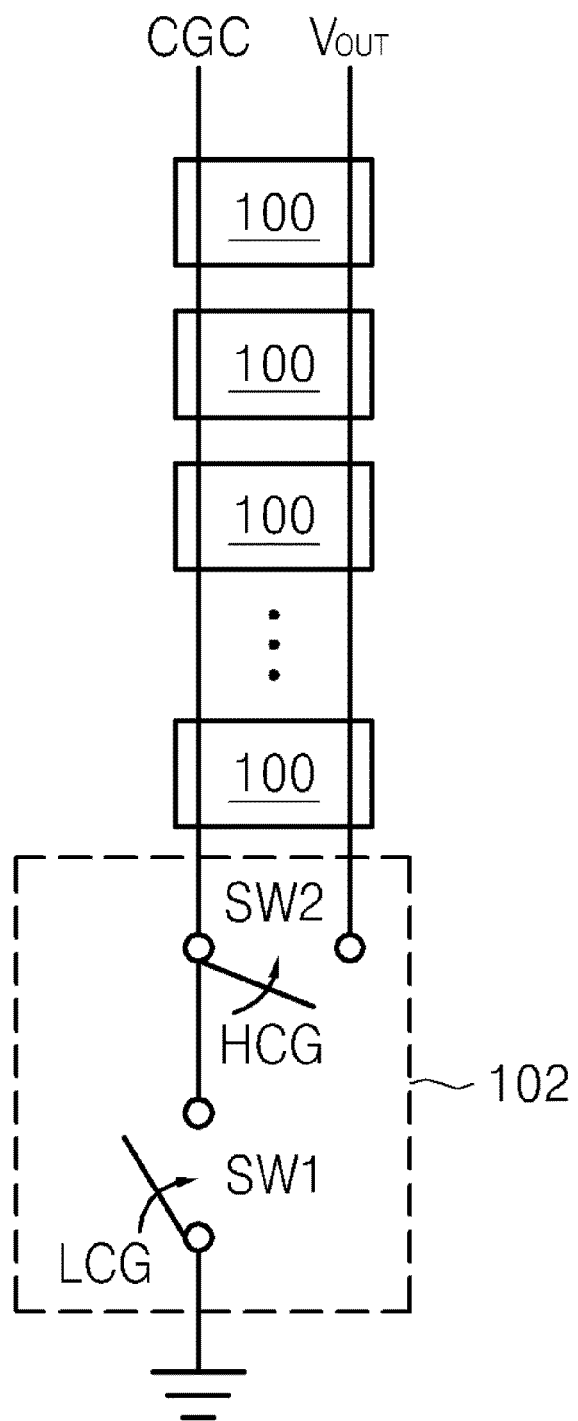
FIG. 4 is a diagram of a pixel array including the pixel illustrated in FIGS. 3A and 3B.

FIG. 4 is a diagram of a pixel array including the pixel 100 illustrated in FIGS. 3A and 3B. For clarity of the description, pixels 100 corresponding to only one of the columns in the pixel array 40 are illustrated in FIG. 4.

Referring to FIGS. 1 through 4, the conversion gain control line CGC corresponding to the pixels 100 may be connected to the ground line or the output line based on the operations of the first and second switches SW1 and SW2, which are respectively controlled by the low and high conversion gain control signals LCG and HCG received from the timing controller 20.

The switching circuit 102 is implemented using the two switches SW1 and SW2 in the embodiments illustrated in FIGS. 3B and 4, but the inventive concept is not restricted to these embodiments. For instance, the switching circuit 102 may be implemented using a transistor.

Figure 5:
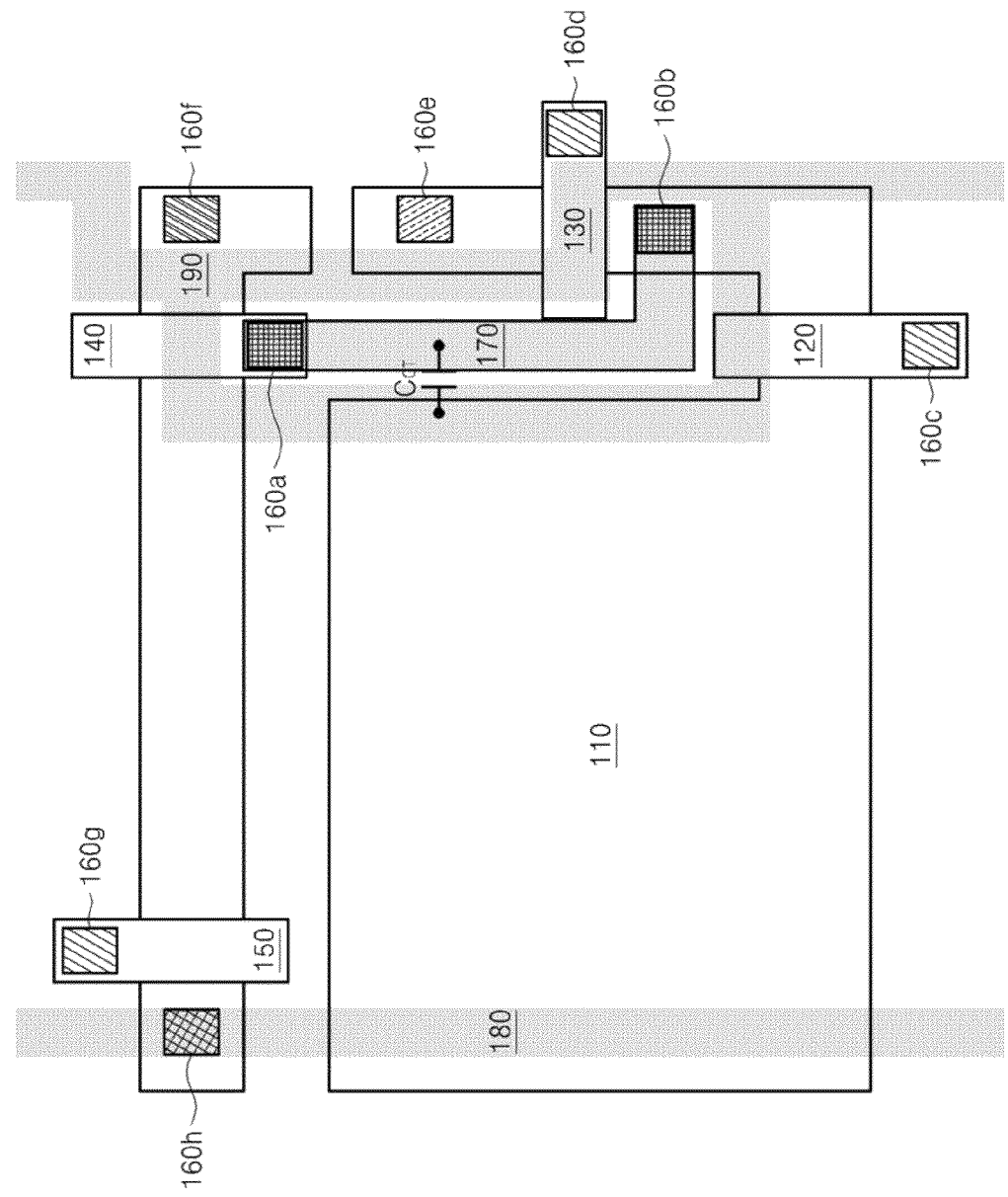
FIG. 5 is a plan view of the pixel illustrated in FIGS. 3A and 3B.

FIG. 5 is a plan view of the pixel 100 illustrated in FIGS. 3A and 3B. Referring to FIGS. 1 through 5, the pixel 100 of the image sensor 10 includes a light receiving area 110 (e.g., a photodiode), a transfer gate 120 forming a transfer transistor, a reset gate 130 forming a reset transistor, a drive gate 140 forming a drive transistor, and a select gate 150 forming a select transistor.

The transfer gate 120 may receive a gate control signal through a metal contact 160c. The reset gate 130 may receive a gate control signal through a metal contact 160d. The select gate 150 may receive a gate control signal through a metal contact 160g.

A drain terminal of the reset transistor may receive a reset voltage through a metal contact 160e. A drain terminal of the drive transistor may be connected to a power supply voltage node through a metal contact 160f. The drive gate 140 is connected to a source terminal of the reset transistor through a metal contact 160a and a metal contact 160b.

A sensing node 170 may include a parasitic capacitor formed through the two metal contacts 160a and 160b. The source terminal of the reset transistor may be referred to as a floating diffusion (FD) node or the sensing node 170. A source terminal of the select transistor is connected to an output line 180 through a metal contact 160h.

The output line 180 is connected to the metal contact 160h and may be disposed separated from a conversion gain control line 190.

The conversion gain control line 190 may be disposed to surround the sensing node 170. Since the conversion gain control line 190 is disposed to surround the sensing node 170, the sensing node 170 is isolated from the metal contacts 160c, 160d, and 160g of the respective gates 120, 130, and 150, so that parasitic capacitance between the sensing node 170 and each of the metal contacts 160c, 160d, and 160g of the respective gates 120, 130, and 150 can be reduced.

The conversion gain control line 190 may be disposed to surround only at least part of the metal contacts 160c, 160d, and 160g instead of surrounding the sensing node 170. The metal contacts 160a through 160h may be replaced with different types of contacts having conductivity like poly silicon. The drive transistor may include a source follower structure.

At this time, the capacitor $C_{CT}$ may be a parasitic capacitor formed between the sensing node 170 and the conversion gain control line 190. To isolate the sensing node 170 from the metal contacts 160c, 160d, and 160g of the respective gates 120, 130, and 150, the conversion gain control line 190 may be disposed to surround the sensing node 170 or to surround only at least part of the metal contacts 160c, 160d, and 160g, as described above, or the conversion gain control line 190 may be disposed between the sensing node 170 and at least one of the metal contacts 160c, 160d, and 160g. However, the present invention is not restricted to those embodiments.

In other words, when the conversion gain control line 190 separated from the output line 180 is selectively connected to the output line 180 or the ground line, the effective capacitance of the sensing node 170 can be adjusted to be increased or decreased.

Figure 6A:
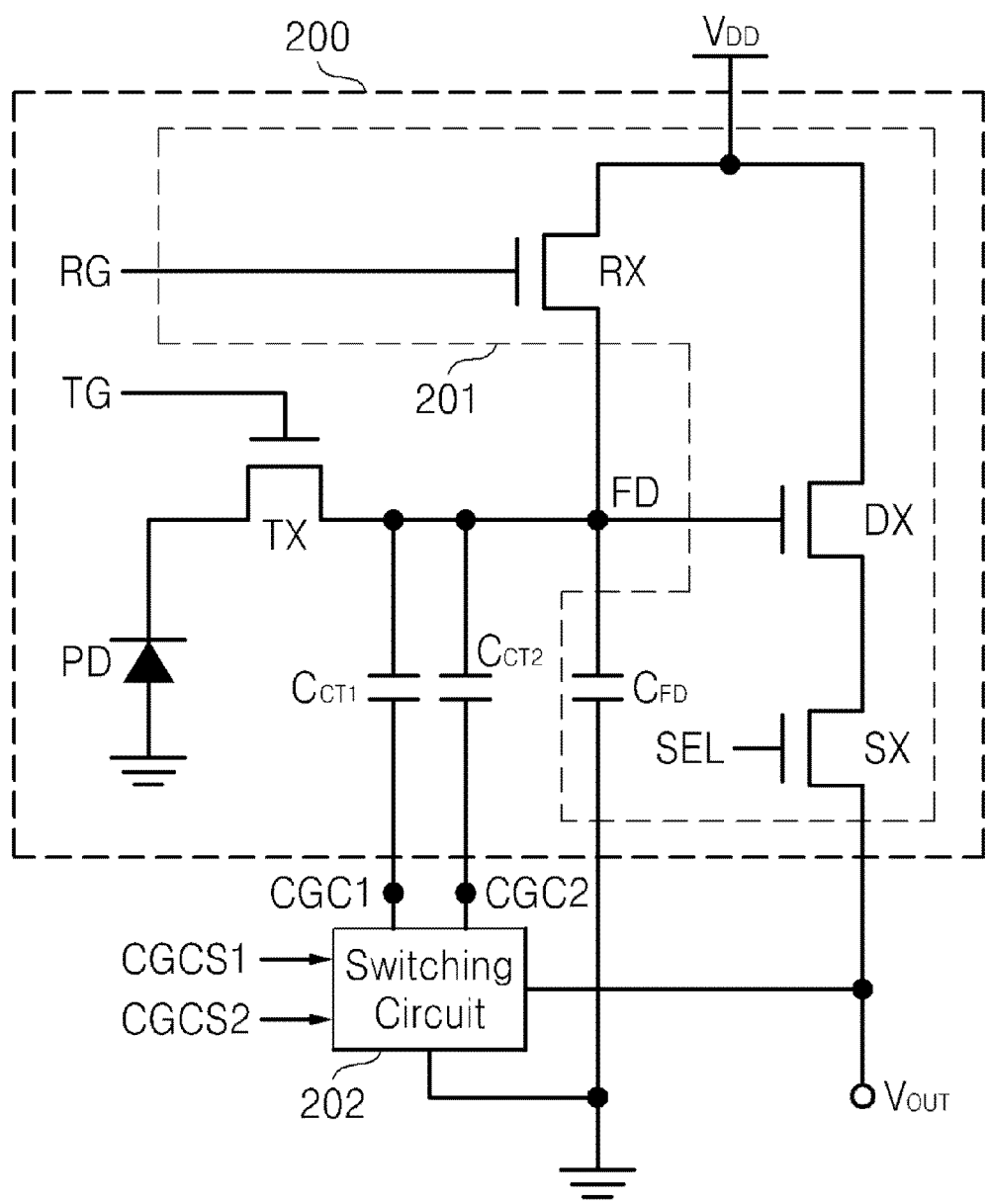

FIGS. 6A and 6B are detailed circuit diagrams of a pixel 200 of an image sensor according to other embodiments of the inventive concept. The pixel 200 illustrated in FIG. 6A is similar to the pixel 100 illustrated in FIG. 3A, and therefore, differences between the pixels 200 and 100 will be mainly described to avoid redundancy.

Referring to FIG. 6A, the pixel 200 includes a photodiode PD, a sensing node FD, a first capacitor $C_{CT1}$, a second capacitor $C_{CT2}$, a read-out circuit 201, and an output line.

The first and second capacitors $C_{CT1}$ and $C_{CT2}$ may be parasitic capacitors formed between the sensing node FD and first and second conversion gain control lines CGC1 and CGC2, respectively. A switching circuit 202 connects the conversion gain control lines CGC1 and CGC2 to a ground line or the output line based on a first conversion gain control signal CGCS1 and a second conversion gain control signal CGCS2, respectively. The first conversion gain control signal CGCS1 may include a first low conversion gain control signal LCG1 and a first high conversion gain control signal HCG1. The second conversion gain control signal CGCS2 may include a second low conversion gain control signal LCG2 and a second high conversion gain control signal HCG2.

Referring to FIG. 6B, the first capacitor $C_{CT1}$ is formed between the sensing node FD and the first conversion gain control line CGC1, and the second capacitor $C_{CT2}$ is formed between the sensing node FD and the second conversion gain control line CGC2.

The switching circuit 202 may selectively connect the first and second conversion gain control lines CGC1 and CGC2 to the ground line or the output line based on the conversion gain control signal LCG1, HCG1, LCG2, and HCG2.

In other words, the timing controller 20 may output the low conversion gain control signals LCG1 and LCG2 and the high conversion gain control signals HCG1 and HCG2 for controlling a third through sixth switches SW3, SW4, SW5, and SW6, respectively, so that the first and second conversion gain control lines CGC1 and CGC2 are connected to the ground line or the output line based on the strength of an optical signal received from the photodiode PD.

For instance, when the third and fifth switches SW3 and SW5 are closed based on the first and second low conversion gain control signals LCG1 and LCG2 output from the timing controller 20, effective capacitance at the sensing node FD increases to $C_{CT1}+C_{CT2}+C_{FD}$, and therefore, the conversion gain of the image sensor decreases.

When the fourth and fifth switches SW4 and SW5 are closed based on the first high conversion gain control signal HCG1 and the second low conversion gain control signal LCG2 output from the timing controller 20, the effective capacitance at the sensing node FD decreases to $(0.1)C_{CT1}+C_{CT2}+C_{FD}$, and therefore, the conversion gain of the image sensor increases as compared to when the third and fifth switches SW3 and SW5 are closed.

When the third and sixth switches SW3 and SW6 are closed based on the first low conversion gain control signal LCG1 and the second high conversion gain control signal HCG2 output from the timing controller 20, the effective capacitance at the sensing node FD decreases to $C_{CT1}+(0.1)C_{CT2}+C_{FD}$, and therefore, the conversion gain of the image sensor increases as compared to when the third and fifth switches SW3 and SW5 are closed.

When the fourth and sixth switches SW4 and SW6 are closed based on the first and second high conversion gain control signals HCG1 and HCG2 output from the timing controller 20, the effective capacitance at the sensing node FD decreases to $(0.1)(C_{CT1}+C_{CT2})+C_{FD}$, and therefore, the conversion gain of the image sensor increases.

Consequently, an output voltage is controlled by increasing or decreasing the effective capacitance at the sensing node FD based on the strength of an optical signal received from the photodiode PD, so that the conversion gain of the image sensor is adjusted to be decreased or increased.

The first and second capacitors $C_{CT1}$ and $C_{CT2}$ are formed in parallel between the sensing node FD and the conversion gain control line CGC in the embodiments illustrated in FIGS. 6A and 6B, but the inventive concept is not restricted to those embodiments.

Figure 7:
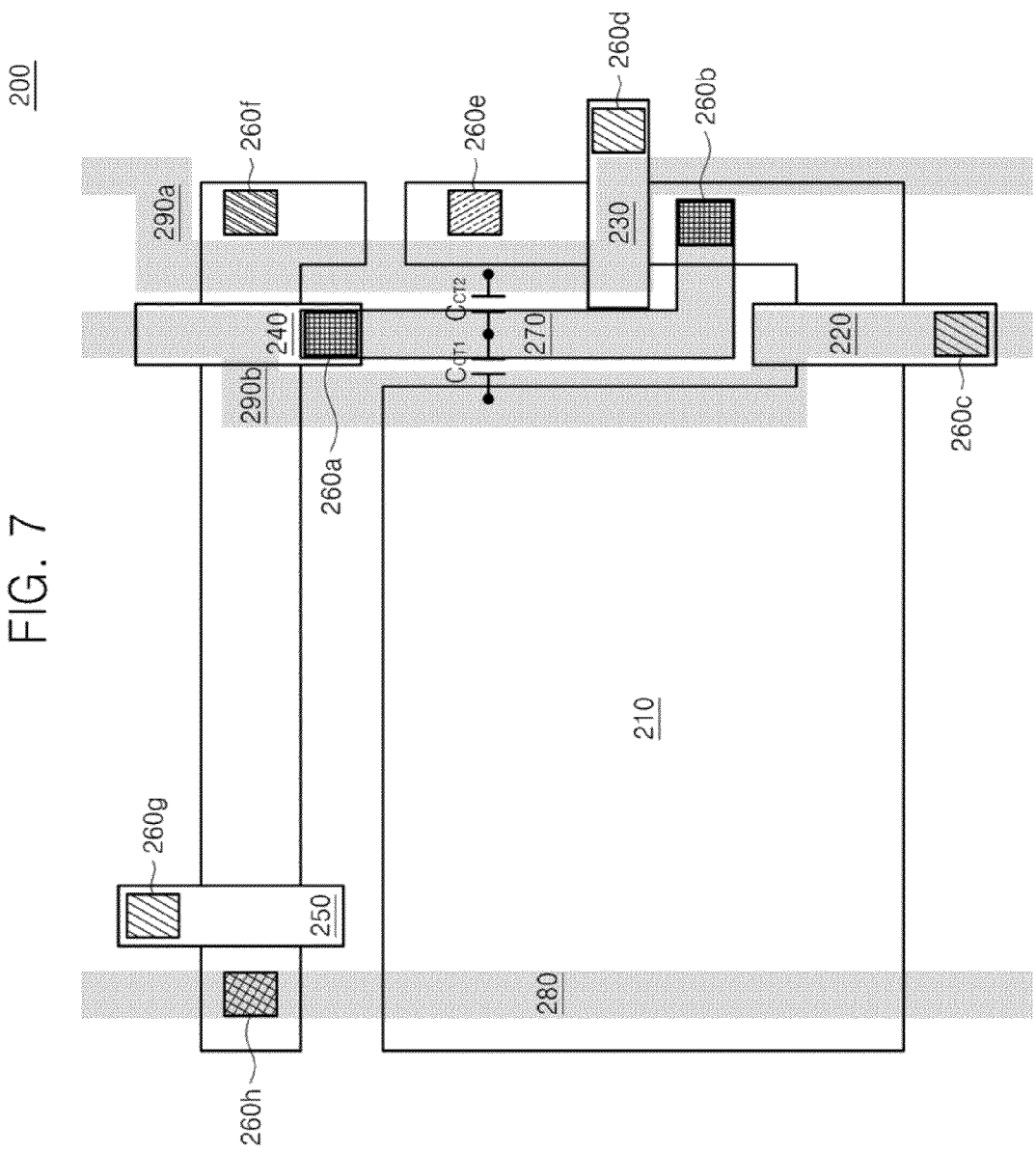
FIG. 7 is a plan view of the pixel illustrated in FIGS. 6A and 6B.

FIG. 7 is a plan view of the pixel 200 illustrated in FIGS. 6A and 6B. The pixel 200 illustrated in FIG. 7 is similar to the pixel 100 illustrated in FIG. 5, and therefore, differences between the pixels 200 and 100 will be mainly described to avoid redundancy.

An output line 280 of the pixel 200 may be disposed separated from a first conversion gain control line 290a and a second conversion gain control line 290b. The first and second conversion gain control lines 290a and 290b may be disposed separated from each other.

A sensing node 270 may be horizontally disposed between the first and second conversion gain control lines 290a and 290b. At this time, the first capacitor $C_{CT1}$ may be formed between the second conversion gain control line 290b and the sensing node 270, and the second capacitor $C_{CT2}$ may be formed between the sensing node 270 and the first conversion gain control line 290a.

In other words, when the first and second conversion gain control lines 290a and 290b separated from the output line 280 are selectively connected to the output line 280 or the ground line, the effective capacitance of the sensing node 270 can be adjusted to be increased or decreased.

Figure 8:
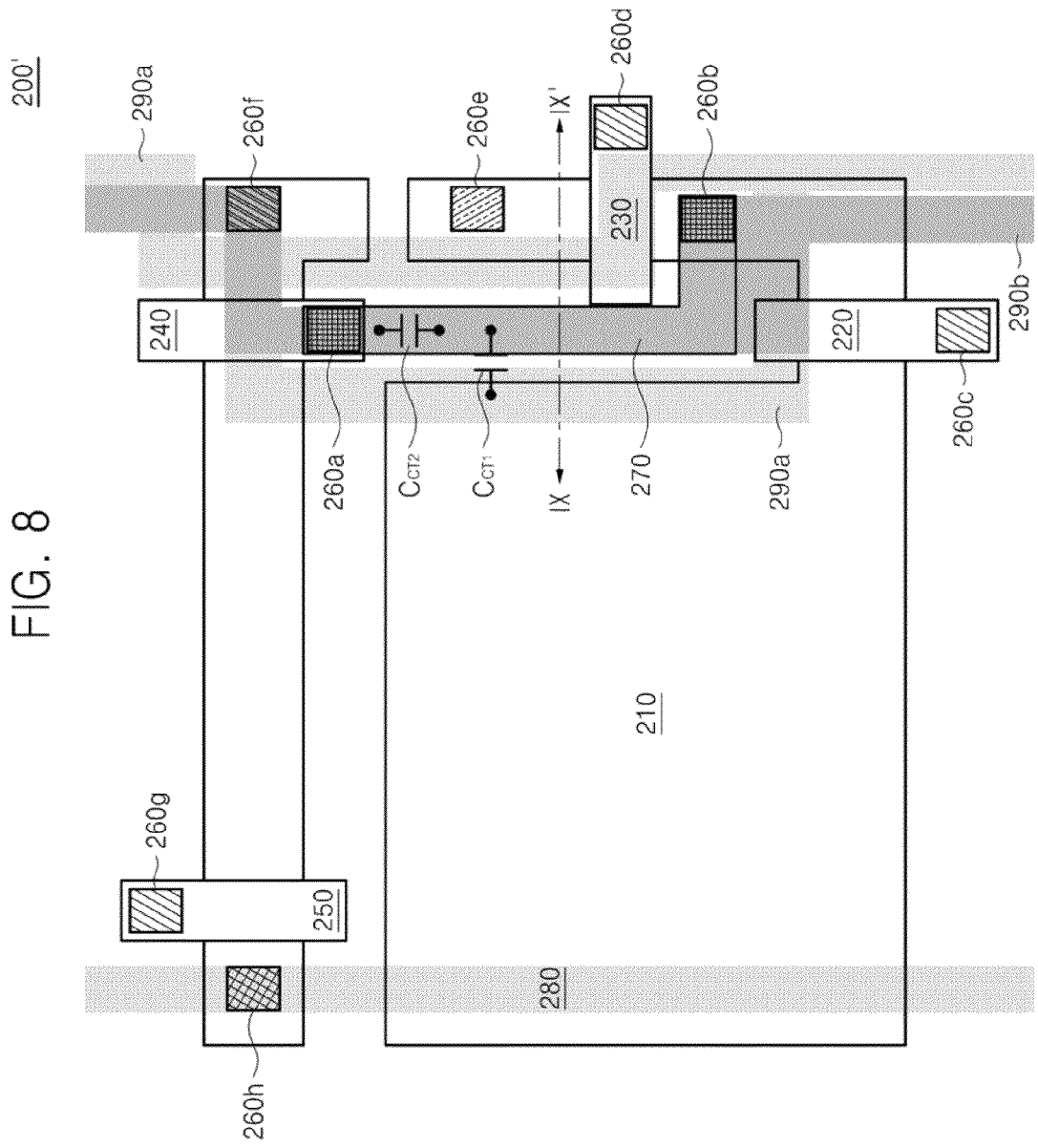
FIG. 8 is a plan view of a modification of the pixel illustrated in FIG. 7.
Figure 9:
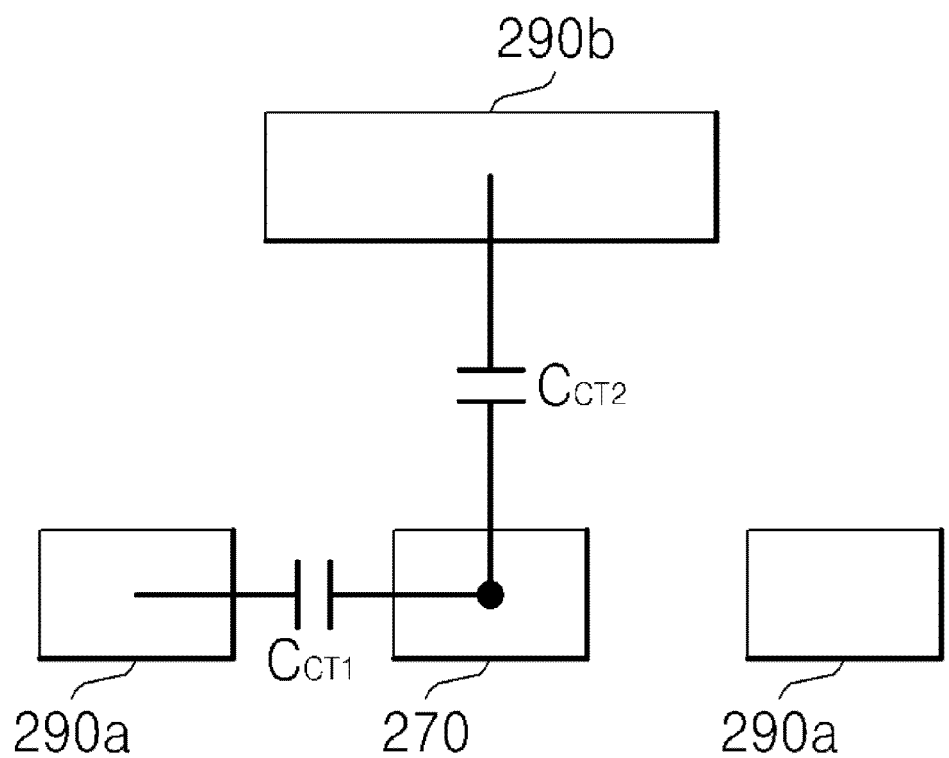
FIG. 9 is a diagram of a cross-section of the pixel, taken along the line a-a' illustrated in FIG. 8.

FIG. 8 is a plan view of a modification 200' of the pixel 200 illustrated in FIG. 7. FIG. 9 is a diagram of a cross-section of the pixel 200', taken along the line IX-IX' illustrated in FIG. 8. The structure illustrated in FIG. 8 is substantially the same as the structures illustrated in FIGS. 5 and 7 except for the layout of the first and second conversion gain control lines 290a and 290b, and therefore, differences between the pixels 200' and 200 will be mainly described to avoid redundancy.

Referring to FIG. 8, the first conversion gain control line 290a of the pixel 200' may be disposed separated from the output line 280 on the same layer as the output line 280. The first conversion gain control line 290a may be disposed to surround the sensing node 270. The second conversion gain control line 290b may be disposed on an upper layer stacked on the sensing node 270 and the first conversion gain control line 290a.

At this time, as illustrated in FIG. 9, the first capacitor $C_{CT1}$ may be formed between the first conversion gain control line 290a and the sensing node 270. The second capacitor $C_{CT2}$ may be formed between the sensing node 270 and the second conversion gain control line 290b, which are respectively disposed on different layers.

Figure 10:
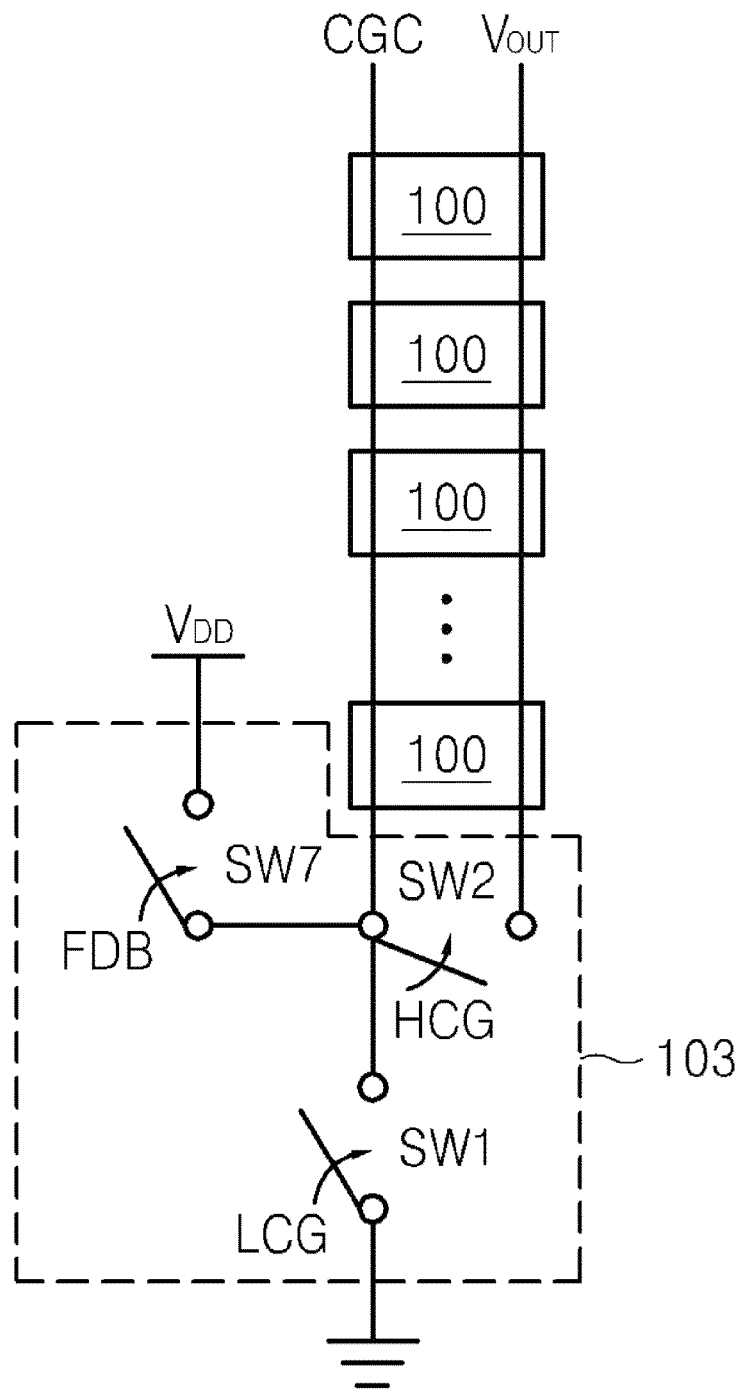
FIG. 10 is a diagram of a pixel array for explaining a method of boosting a sensing node of the pixel illustrated in FIGS. 3A and 3B.
Figure 11:
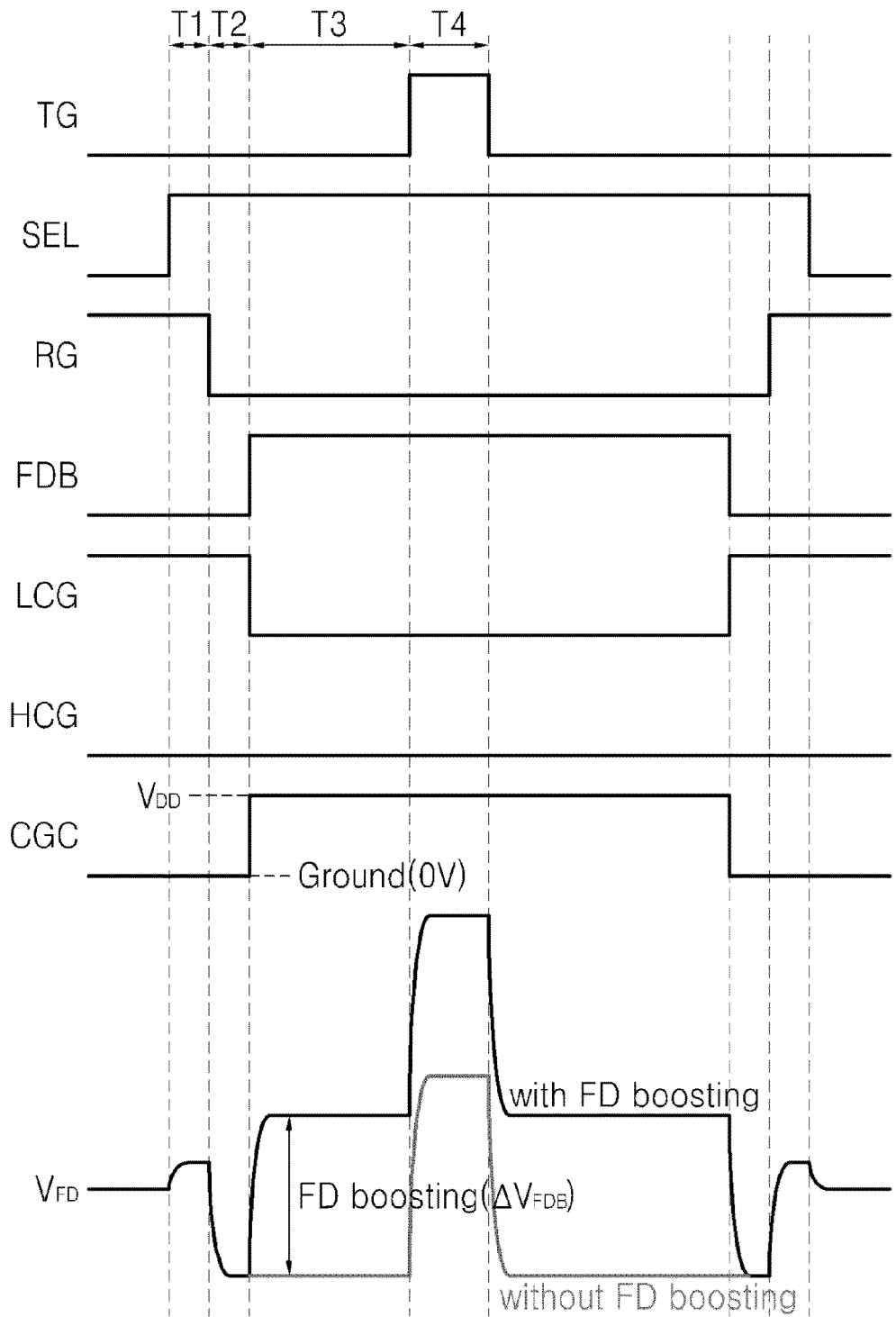
FIG. 11 is a timing chart for explaining a method of boosting a sensing node in a low conversion gain mode of the pixel illustrated in FIGS. 3A and 3B.
Figure 12:
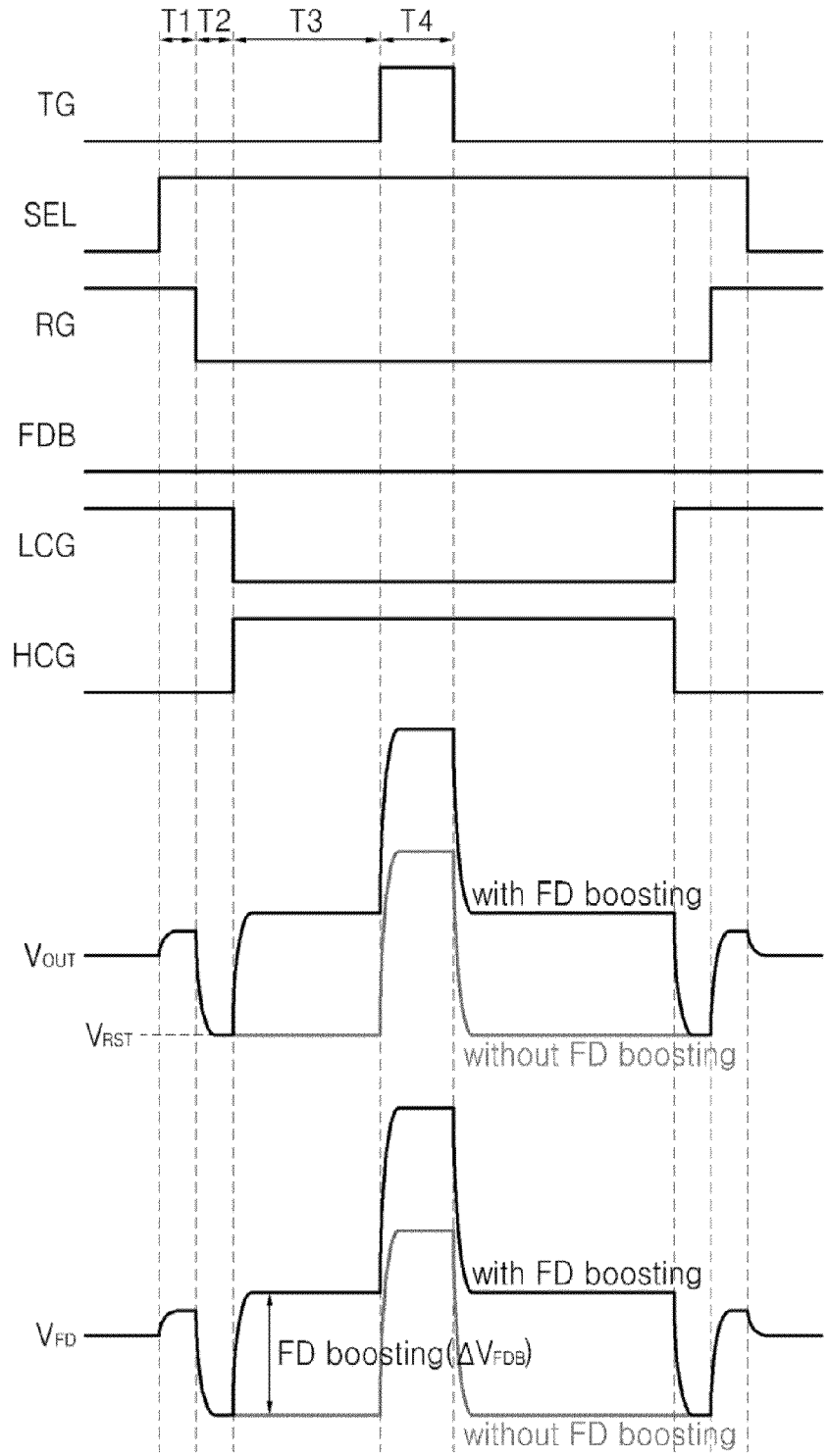
FIG. 12 is a timing chart for explaining a method of boosting the sensing node in a high conversion gain mode of the pixel illustrated in FIGS. 3A and 3B.

FIG. 10 is a diagram of a pixel array for explaining a method of boosting the sensing node FD of the pixel 100 illustrated in FIGS. 3A and 3B. FIG. 11 is a timing chart for explaining a method of boosting the sensing node FD in a low conversion gain mode of the pixel 100 illustrated in FIGS. 3A and 3B. FIG. 12 is a timing chart for explaining a method of boosting the sensing node FD in a high conversion gain mode of the pixel 100 illustrated in FIGS. 3A and 3B.

Referring to FIG. 10, a switching circuit 103 may include a seventh switch SW7 in addition to first and second switches SW1 and SW2 used to connect the conversion gain control line CGC to a ground line or an output line based on the low and high conversion gain control signals LCG and HCG.

The seventh switch SW7 is closed based on a boosting control signal FDB received from the timing controller 20.

When the seventh switch SW7 is closed, the conversion gain control line CGC may be connected to a power supply voltage $V_{DD}$.

Referring to FIGS. 3A through 11, in first and second periods T1 and T2, the first switch SW1 is closed based on the low conversion gain control signal LCG received from the timing controller 20, thereby connecting the conversion gain control line CGC to the ground line.

In a third period T3, the first switch SW1 is turned off in a state where the conversion gain control line CGC is connected to the ground line, and the seventh switch SW7 is closed based on the boosting control signal FDB, so that the conversion gain control line CGC is connected to the power supply voltage $V_{DD}$. Then, a voltage $V_{FD}$ at the sensing node FD is increased from a ground voltage by a boosting voltage $\Delta V_{FDB}$. At this time, the boosting voltage $\Delta V_{FDB}$ may be calculated based on the power supply voltage $V_{DD}$ using Equation 2:

$$\Delta V_{FDB} = \frac{C_{CT}}{C_{CT} + C_{FD}} V_{DD}. \quad (2)$$

In a fourth period T4, in response to a transfer gate control signal TG, photogenerated charge is transferred from the photodiode PD to the sensing node FD using the voltage $V_{FD}$ boosted from the ground voltage by the boosting voltage $\Delta V_{FDB}$.

In other words, in the low conversion gain mode in which the strength of an optical signal received from the photodiode PD is high, the voltage $V_{FD}$ at the sensing node FD is boosted based on the power supply voltage $V_{DD}$, so that the photodiode PD can quickly transfer the photogenerated charge to the sensing node FD.

Referring to FIG. 12, when a reset gate control signal RG transits from a high level to a low level in first and second periods T1 and T2, the conversion gain control line CGC, which has been connected to the ground line based on the low conversion gain control signal LCG received from the timing controller 20, is switched to the output line based on the high conversion gain control signal HCG.

In a third period T3, in a state where the conversion gain control line CGC is connected to the output line, the voltage $V_{FD}$ at the sensing node FD is increased from the ground voltage by the boosting voltage $\Delta V_{FDB}$. At this time, the boosting voltage $\Delta V_{FDB}$ may be calculated based on a reset voltage $V_{RST}$ using Equation 3:

$$\Delta V_{FDB} = \frac{C_{CT}}{C_{CT} + C_{FD}} V_{RST}. \quad (3)$$

where the reset voltage $V_{RST}$ has a positive value less than the power supply voltage $V_{DD}$.

In a fourth period T4, in response to the transfer gate control signal TG, photogenerated charge is transferred from the photodiode PD to the sensing node FD using the voltage $V_{FD}$ boosted from the ground voltage by the boosting voltage $\Delta V_{FDB}$.

In other words, in the high conversion gain mode in which the strength of an optical signal received from the photodiode PD is low, the voltage $V_{FD}$ at the sensing node FD is boosted based on the reset voltage $V_{RST}$, so that the photodiode PD can quickly transfer the photogenerated charge to the sensing node FD.

At this time, since the timing at which the transfer gate control signal TG for transmitting the photogenerated charge from the photodiode PD to the sensing node FD is turned on and off is fixed, it may happen that the photogenerated charge is not transferred to the sensing node FD during the on time of the transfer gate control signal TG even if both the strength of the optical signal received from the photodiode PD and the capacitance at the sensing node FD are high.

In this case, the photogenerated charge can be quickly transferred from the photodiode PD to the sensing node FD by increasing the voltage $V_{FD}$ at the sensing node FD.

Figure 13:
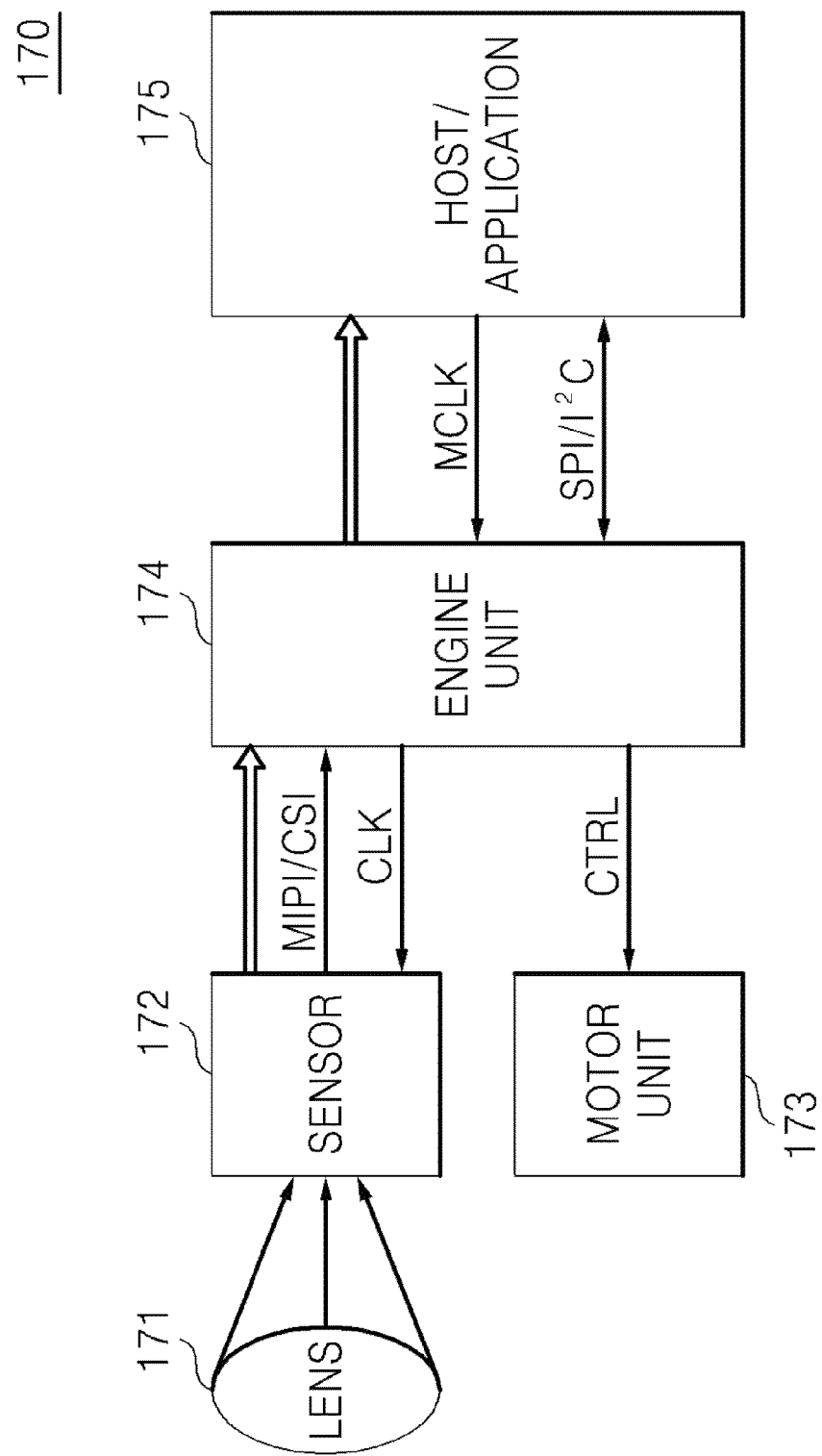
FIG. 13 is a block diagram of a camera system according to some example embodiments.

FIG. 13 is a block diagram of a camera system 170 according to some embodiments of the inventive concept. The camera system 170 may be a digital camera.

Referring to FIG. 13, the camera system 170 may include a lens 171, an image sensor 172, a motor unit 173, and an engine unit 174. The pixel structure illustrated in FIGS. 1 through 12 may be used in the image sensor 172.

The lens 171 focuses incident light onto a light receiving area (e.g., a photodiode) in the image sensor 172. The image sensor 172 generates image data based on the incident light received through the lens 171. The image sensor 172 provides the image data based on a clock signal CLK. The image sensor 172 may interface with the engine unit 174 using a mobile industry processor interface (MIPI) and/or a camera serial interface (CSI). The motor unit 173 may adjust the focus of the lens 171 in response to a control signal CTRL received from the engine unit 174 or perform shuttering. The engine unit 174 controls the image sensor 172 and the motor unit 173. The engine unit 174 may generate luma and chrominance (YUV) data including a distance to an object, a luminance component, a difference between the luminance component and a blue component, and a difference between the luminance component and a red component based on distance and/or image data received from the image sensor 172 or generate compressed data, e.g., Joint Photography Experts Group (JPEG) data. The engine unit 174 may be connected to a host/application 175 and may provide the YUV data or JPEG data to the host/application 175 based on a master clock signal MCLK. In addition, the engine unit 174 may interface with the host/application 175 using a serial peripheral interface (SPI) and/or an inter integrated circuit ($I^2C$).

Figure 14:
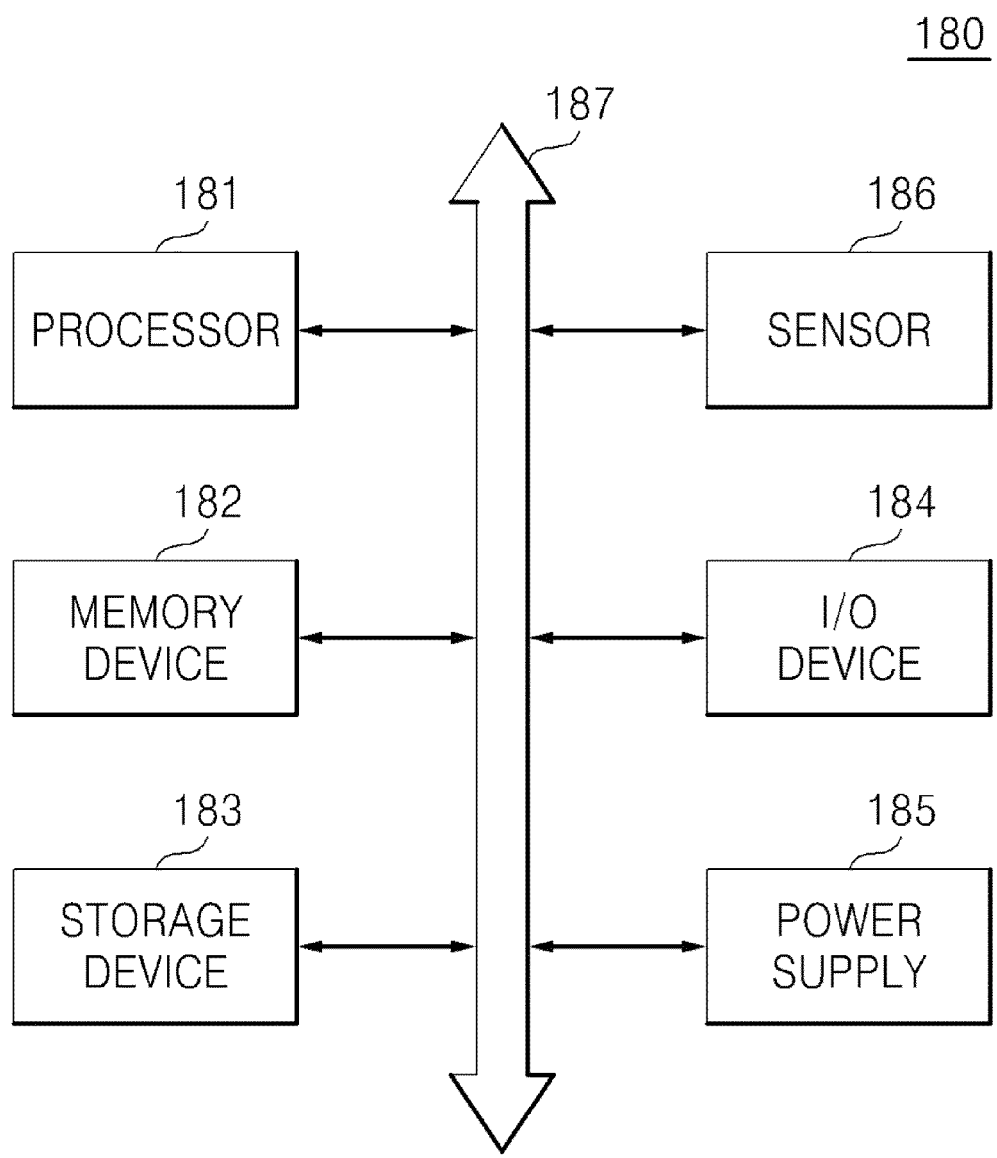
FIG. 14 is a block diagram of a computing system according to some example embodiments.

FIG. 14 is a block diagram of a computing system 180 according to some embodiments of the inventive concept.

Referring to FIG. 14, the computing system 180 may include a processor 181, a memory device 182, a storage device 183, an input/output (I/O) device 184, a power supply 185, and an image sensor 186. The computing system 180 also may include one or more buses 187. The pixel structure illustrated in FIGS. 1 through 12 may be used in the image sensor 186.

Although not shown in FIG. 14, the computing system 180 may also include ports that can communicate with video cards, sound cards, memory cards, universal serial bus (USB) devices, or other electronic devices.

The processor 181 may perform particular calculations or tasks. The processor 181 may be a microprocessor or a central processing unit (CPU). The processor 181 may communicate with the memory device 182, the storage device 183, and the I/O device 184 through an address bus, a control bus, and a data bus.

The processor 181 may also be connected to an extended bus such as a peripheral component interconnect (PCI) bus. The memory device 182 may store data necessary for the operations of the computing system 180. The memory device 182 may be implemented by dynamic random access memory (DRAM), mobile DRAM, static RAM (SRAM), phasechange RAM (PRAM), ferroelectric RAM (FRAM), resistive RAM (RRAM) and/or magnetoresistive RAM (MRAM).

The storage device 183 may include a solid state drive (SSD), a hard disk drive (HDD), and a compact disk-read only memory (CD-ROM). The I/O device 184 may include an input device such as a keyboard, a keypad, or a mouse and an output device such as a printer or a display. The power supply 185 may provide an operating voltage necessary for the operation of the computing system 180.

The image sensor 186 may communicate with the processor 181 through buses or other communication links. The image sensor 186 and the processor 181 may be integrated together into a single chip or may be separately integrated into different chips, respectively. The computing system 180 may be any type of computing system using the image sensor 186. For instance, the computing system 180 may be a digital camera, a cellular phone, a personal digital assistant (PDA), a portable multimedia player (PMP), or a smart phone.

Figure 15:
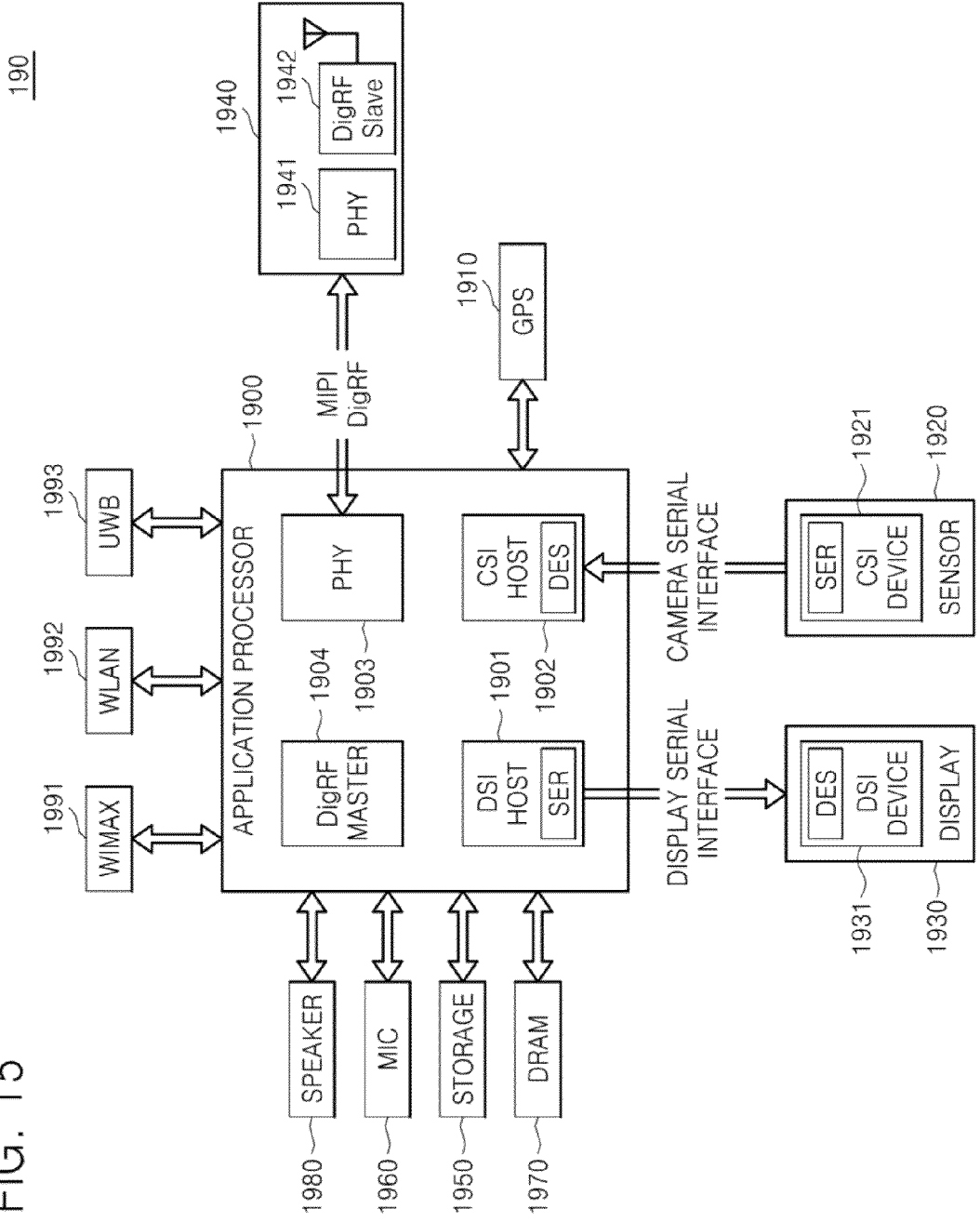
FIG. 15 is a block diagram of interfaces used in the computing system illustrated in FIG. 14.

FIG. 15 is a block diagram of interfaces used in the computing system illustrated in FIG. 14. Referring FIG. 15, the computing system 190 may be implemented by a data processing apparatus, such as a mobile phone, a PDA, a PMP, an IP TV, or a smart phone that can use or support the MIPI interface. The computing system 190 includes an application processor (AP) 1900, an image sensor 1920, and a display 1930.

A CSI host 1902 included in the application processor 1900 performs serial communication with a CSI device 1921 included in the image sensor 1920 through CSI.

For example, an optical de-serializer may be implemented in the CSI host 1902, and an optical serializer may be implemented in the CSI device 1921. The structure of the pixel, as described referring to FIGS. 1 through 12, may be used in the image sensor 1920.

A display serial interface (DSI) host 1901 included in the application processor 1900 performs serial communication with a DSI device 1931 included in the display 1930 through DSI. For example, an optical serializer (SER) may be implemented in the DSI host 1901, and an optical de-serializer (DES) may be implemented in the DSI device 1931.

The computing system 190 may also include a radio frequency (RF) chip 1940 which communicates with the application processor 1900. A physical layer (PHY) 1903 of the computing system 190 and a PHY 1941 of the RF chip 1940 communicate data with each other according to a MIPI DigRF standard. The MIPI DigRF standard also may be used, for example, with DigRF Master 1904 and/or DigRF Slave 1942. The computing system 190 may further include at least one element among a global positioning system (GPS) 1910, a storage device 1950, a microphone 1960, a DRAM 1970 and a speaker 1980. The computing system 190 may communicate using Ultra WideB and (UWB) 1993, Wireless Local Area Network (WLAN) 1992 or Worldwide Interoperability for Microwave Access (WIMAX) 1991, etc.

The structure and interfaces of the computing system 190 are some exemplary embodiments and are not restricted thereto.

The present general inventive concept can also be embodied as computer-readable codes on a computer-readable medium. The computer-readable recording medium is any data storage device that can store data as a program which can be thereafter read by a computer system. Examples of the computer-readable recording medium include read-only memory (ROM), random-access memory (RAM), CD-ROMs, magnetic tapes, floppy disks, and optical data storage devices.

The computer-readable recording medium can also be distributed over network coupled computer systems so that the computer-readable code is stored and executed in a distributed fashion. Also, functional programs, codes, and code segments to accomplish the present general inventive concept can be easily construed by programmers.

As described above, according to some embodiments of the inventive concept, a conversion gain is adjusted to be decreased or increased without reducing a light receiving area in an image sensor.

Since the conversion gain of the image sensor can be adjusted, a signal-to-noise ratio (SNR) is increased at a white level by processing a maximum amount of photogenerated charge by reducing the conversion gain, and sensitivity is increased at a black level by increasing the conversion gain.

While example embodiments have been particularly shown and described, it will be understood by those of ordinary skill in the art that various changes in form and details may be made therein without departing from the spirit and scope of the present invention as defined by the following claims.

What is claimed is:

1. An image sensor, comprising:
  a photodiode configured to convert an optical signal into photogenerated charge;
  a sensing node adjacent to the photodiode and configured to sense the photogenerated charge;
  a read-out circuit configured to convert the photogenerated charge into an electrical signal and to output the electrical signal through an output line; and
  at least one capacitor formed between the sensing node and a conversion gain control line;
  wherein the conversion gain control line corresponding to the at least one capacitor is selectively connected to a ground line or the output line based on at least one control signal.

2. The image sensor of claim 1, wherein the read-out circuit comprises:
  a drive transistor configured to operate as a source follower amplifier having an output of the sensing node as an input; and
  a select transistor connected in series between a source terminal of the source follower amplifier and the output line.

3. The image sensor of claim 1, wherein the conversion gain control line is separated from the output line, and
  wherein the conversion gain control line is configured to surround the sensing node.

4. The image sensor of claim 1, further comprising:
  at least two capacitors;
  wherein the sensing node is horizontally between a first conversion gain control line and a second conversion gain control line, which are separated from the output line,
  wherein a first capacitor of the at least two capacitors is formed between the first conversion gain control line and the sensing node, and
  wherein a second capacitor of the at least two capacitors is formed between the sensing node and the second conversion gain control line.

5. The image sensor of claim 1, further comprising:
  at least two capacitors;
  wherein a first conversion gain control line is separated from the output line and is configured to surround the sensing node,
  wherein a second conversion gain control line is stacked on the first conversion gain control line, wherein a first capacitor of the at least two capacitors is formed between the first conversion gain control line and the sensing node, and wherein a second capacitor of the at least two capacitors is formed between the sensing node and the second conversion gain control line.

6. The image sensor of claim 1, further comprising:
a switch configured to be connected between the conversion gain control line and a power supply voltage, and to connect the conversion gain control line to the power supply voltage based on a boosting control signal;

wherein when the conversion gain control line is connected to the ground line, a voltage at the sensing node is increased based on the boosting control signal by a boosting voltage corresponding to the power supply voltage.

7. The image sensor of claim 6, wherein when the conversion gain control line is connected to the output line, the voltage at the sensing node is increased based on the boosting control signal by a boosting voltage corresponding to a reset voltage.

8. An image sensor, comprising:
a pixel array comprising a plurality of pixels;
a timing controller configured to control operation of the pixel array and to generate at least one control signal for controlling an output of each of the pixels; and
a switching circuit comprising a plurality of switches corresponding to a plurality of column lines comprised in the pixel array to adjust a conversion gain of pixels corresponding to each of the columns based on the at least one control signal;
wherein each pixel comprises:
a photodiode configured to convert an optical signal into photogenerated charge;
a sensing node adjacent to the photodiode and configured to sense the photogenerated charge;
a read-out circuit configured to convert the photogenerated charge into an electrical signal and to output the electrical signal through an output line; and
at least one capacitor formed between the sensing node and a conversion gain control line; and
wherein the switching circuit is configured to selectively control connection of the conversion gain control line.

9. The image sensor of claim 8, wherein the read-out circuit comprises:
a drive transistor configured to operate as a source follower amplifier having an output of the sensing node as an input; and
a select transistor connected in series between a source terminal of the source follower amplifier and the output line.

10. The image sensor of claim 8, wherein the conversion gain control line corresponding to the at least one capacitor is selectively connected to a ground line or the output line based on the at least one control signal.

11. An image processing device, comprising:
the image sensor of claim 8; and
a processor configured to control operation of the image sensor.

12. The image processing device of claim 11, wherein the image processing device includes one or more of a mobile phone, a tablet personal computer (PC), and a digital single-lens reflex (DSLR) camera.

13. An image sensor, comprising:
a photodiode configured to convert an optical signal into photogenerated charge;
a sensing node configured to sense the photogenerated charge;
a read-out circuit configured to convert the photogenerated charge into an electrical signal and to output the electrical signal; and
one or more capacitors between the sensing node and one or more conversion gain control lines;
wherein the one or more conversion gain control lines corresponding to the one or more capacitors are selectively connected to a ground line or an output line based on one or more control signals.

14. The image sensor of claim 13, wherein a first conversion gain control line corresponding to a first capacitor is selectively connected to the ground line or the output line based on a first control signal, and
wherein a second conversion gain control line corresponding to a second capacitor is selectively connected to the ground line or the output line based on a second control signal.

15. The image sensor of claim 13, further comprising:
at least two capacitors;
wherein the sensing node is between a first conversion gain control line and a second conversion gain control line,
wherein the first conversion gain control line is separated from the output line,
wherein the second conversion gain control line is separated from the output line,
wherein a first capacitor of the at least two capacitors is between the sensing node and the first conversion gain control line, and
wherein a second capacitor of the at least two capacitors is between the sensing node and the second conversion gain control line.

16. The image sensor of claim 15, wherein the first conversion gain control line is on a first side of the sensing node,
wherein the second conversion gain control line is on a second side of the sensing node, and
wherein the first side of the sensing node is opposite to the second side of the sensing node.

17. The image sensor of claim 15, wherein a first portion of the first conversion gain control line is on a first side of the sensing node,
wherein a second portion of the first conversion gain control line is on a second side of the sensing node,
wherein the second conversion gain control line is on a third side of the sensing node, and
wherein the first side of the sensing node is opposite to the second side of the sensing node.

18. A computing system comprising the image sensor of claim 13.

19. An image processing device comprising the image sensor of claim 13.

20. A camera system comprising the image sensor of claim 13.

* * * * *